(12) United States Patent
Han et al.

(10) Patent No.: US 10,657,208 B2
(45) Date of Patent: May 19, 2020

(54) ANALYZING MODEL BASED ON DESIGN INTEREST

(71) Applicant: The MathWorks, Inc., Natick, MA (US)

(72) Inventors: Zhi Han, Acton, MA (US); William J. Aldrich, Natick, MA (US); Ebrahim Mehran Mestchian, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 563 days.

(21) Appl. No.: 13/910,100

(22) Filed: Jun. 4, 2013

(65) Prior Publication Data

US 2013/0326472 A1    Dec. 5, 2013

Related U.S. Application Data

(63) Continuation-in-part of application No. 13/117,936, filed on May 27, 2011, now Pat. No. 8,812,276.

(60) Provisional application No. 61/348,969, filed on May 27, 2010.

(51) Int. Cl.
  *G06F 8/10* (2018.01)
  *G06F 17/50* (2006.01)

(52) U.S. Cl.
  CPC .............. *G06F 17/504* (2013.01); *G06F 8/10* (2013.01)

(58) Field of Classification Search
  CPC ................................. G06F 17/504; G06F 8/10
  See application file for complete search history.

(56) References Cited

U.S. PATENT DOCUMENTS

| 5,850,560 | A | 12/1998 | Kang | |
| 7,178,112 | B1 * | 2/2007 | Ciolfi | G06F 17/504 703/2 |
| 7,324,931 | B1 * | 1/2008 | Warlock | G06F 17/504 703/13 |

(Continued)

FOREIGN PATENT DOCUMENTS

WO    WO2007/022289    2/2007

OTHER PUBLICATIONS

Fehnker, Ansgar & Krogh, Bruce, "Hybrid System Verification Is Not a Sinecure: The Electronic Throttle Control Case Study," ATVA 2004, LNCS 3299, 2004, pp. 263-277.

(Continued)

*Primary Examiner* — Jay Hann
(74) *Attorney, Agent, or Firm* — Cesari and McKenna, LLP

(57) ABSTRACT

A device may obtain a model. The model, when executed, may simulate a behavior of a physical system. A user, such as, for example, an engineer, may specify a design interest for the model. The design interest may be associated with a particular behavior of a portion of the model. The device may analyze the model based on the design interest and may determine, based on analyzing the model, a group of model elements, included in the model, that are related to the design interest. The device may generate, based on the group of model elements, a model slice. When the model slice is executed, a behavior of the model slice may correspond to the particular behavior of the portion of the model. The device may analyze the particular behavior of the portion of the model based on executing the model slice.

22 Claims, 20 Drawing Sheets

(56) References Cited

U.S. PATENT DOCUMENTS

| | | | |
|---|---|---|---|
| 7,412,366 B1* | 8/2008 | Englehart | G06F 8/34 703/6 |
| 7,424,410 B2 | 9/2008 | Orofino, II et al. | |
| 7,434,183 B2 | 10/2008 | McGaughy et al. | |
| 7,464,373 B1 | 12/2008 | Yunt et al. | |
| 7,558,712 B1 | 7/2009 | Aldrich | |
| 7,590,614 B2 | 9/2009 | Fildebrandt et al. | |
| 7,644,398 B2 | 1/2010 | Cleaveland et al. | |
| 7,680,632 B1 | 3/2010 | Aldrich | |
| 7,680,637 B1* | 3/2010 | Wolodkin | G06F 17/5022 703/6 |
| 7,698,668 B2 | 4/2010 | Balasubramanian | |
| 7,701,869 B2 | 4/2010 | Hogan | |
| 7,774,172 B1 | 8/2010 | Yunt et al. | |
| 7,809,545 B2 | 10/2010 | Ciolfi et al. | |
| 7,818,730 B1 | 10/2010 | Ryan et al. | |
| 7,912,692 B2* | 3/2011 | Matsushita | G06F 17/504 703/13 |
| 7,934,194 B2 | 4/2011 | Kinnucan, Jr. et al. | |
| 7,941,299 B1 | 5/2011 | Aldrich et al. | |
| 8,041,554 B1 | 10/2011 | Limondin et al. | |
| 8,104,017 B2 | 1/2012 | Lin et al. | |
| 8,108,728 B2 | 1/2012 | Das et al. | |
| 8,131,528 B1 | 3/2012 | Vora et al. | |
| 8,176,479 B2 | 5/2012 | Morrow et al. | |
| 8,522,196 B1 | 8/2013 | Kim et al. | |
| 8,620,629 B1 | 12/2013 | Li et al. | |
| 8,732,669 B2 | 5/2014 | Valdiviezo Basauri et al. | |
| 8,756,562 B2 | 6/2014 | Ciolfi et al. | |
| 9,021,409 B2* | 4/2015 | Vasudevan | G06F 17/504 716/106 |
| 9,152,390 B1 | 10/2015 | Tripakis et al. | |
| 9,183,120 B1 | 11/2015 | Webb | |
| 2003/0167182 A1 | 9/2003 | Bloom et al. | |
| 2007/0157162 A1 | 7/2007 | Ciolfi | |
| 2007/0266366 A1 | 11/2007 | Bucuvalas | |
| 2008/0092109 A1 | 4/2008 | Kinnucan, Jr. et al. | |
| 2008/0092111 A1 | 4/2008 | Kinnucan et al. | |
| 2008/0098349 A1 | 4/2008 | Lin et al. | |
| 2008/0172212 A1 | 7/2008 | Gahinet et al. | |
| 2008/0263506 A1 | 10/2008 | Broadfoot et al. | |
| 2009/0006062 A1 | 1/2009 | Sedukhin et al. | |
| 2009/0013307 A1 | 1/2009 | Raghavan et al. | |
| 2009/0077511 A1 | 3/2009 | Wahler et al. | |
| 2009/0098349 A1 | 4/2009 | Ichikawa | |
| 2009/0193396 A1 | 7/2009 | Hartadinata | |
| 2009/0234640 A1 | 9/2009 | Boegl et al. | |
| 2010/0299651 A1 | 11/2010 | Fainekos et al. | |
| 2011/0078652 A1 | 3/2011 | Mani et al. | |
| 2011/0283260 A1 | 11/2011 | Bucuvalas | |
| 2011/0295578 A1 | 12/2011 | Aldrich et al. | |
| 2012/0179426 A1 | 7/2012 | Fontes et al. | |
| 2014/0358506 A1 | 12/2014 | Aldrich et al. | |
| 2014/0358507 A1 | 12/2014 | Aldrich et al. | |

OTHER PUBLICATIONS

"Notification of Transmittal of the International Search Report and the Written Opinion of the International Searching Authority, or the Declaration," International Filing Date: May 27, 2011, International Application No. PCT/US2011/000965, Applicant: The Mathworks, Inc., dated Oct. 6, 2011, pp. 1-10.

The MathWorks, Inc., "Simulink® Verification and Validation 2: User's Guide", Sep. 2007, 829 pages.

The MathWorks, Inc., "Simulink® Designer Verifier 1: User's Guide", May 2007, 485 pages.

Kaga et al., "Validation of control software specification using design interests extraction and model checking", In SAE 2012 World Congress and Exhibition, Apr. 24, 2012.

Weiser, "Program slicing", IEEE Transactions on Software Engineering, vol. SE-10, No. 4, Jul. 1984, pp. 352-357.

Tip, "A survey of program slicing techniques", Journal of Programming Languages, vol. 3, pp. 121-189 (1995).

Clarke et al., "Model checking and abstraction", ACM Transactions on Programming Languages and Systems, vol. 16, No. 5, Sep. 1994, pp. 1512-1542.

Antoulas et al., "A survey of model reduction methods for large-scale systems", Contemporary Mathematics, Oct. 27, 2006, 28 pages.

Han et al., "Reachability analysis of hybrid control systems using reduced-order models", In IEEE Proc of American Control Conference (ACC'04), pp. 1183-1189, 2004.

Girard et al., "Approximation metrics for discrete and continuous systems", Department of Computer & Information Science—Technical Reports (CIS), 32 pages (2005).

Rewieński et al., "A trajectory piecewise-linear approach to model order reduction and fast simulation of nonlinear circuits and micromachined devices", IEEE Transaction on Computer-Aided Design of Integrated Circuits and Systems, vol. 22, No. 2, pp. 155-170, Feb. 2003.

Han et al., "Reachability analysis of nonlinear systems using trajectory piecewise linearized models", Proceedings of the 2006 American Control Conference, Jun. 14-16, 2006, 6 pages.

Matsubara et al., "Model checking with program slicing based on variable dependence graphs", In Workshop on Formal Techniques for Safety-Critical Systems, Nov. 2012, pp. 56-68.

Pappas, "Bisimilar linear systems", Automatica 39, Jan. 2002, pp. 2035-2047.

Han et al., "Detecting data store access conflict in Simulink by solving Boolean satisfiability problems", In American Control Conference (ACC'10), 2010, 6 pages.

Johnson et al., "The program structure tree: computing control regions in linear time", In Proceedings of the ACM SIGPLAN 1994 conference on Programming language design and implementation, PLDI '94, pp. 171-185, (1994).

Heckel, "Graph transformation in a nutshell" Electron Notes Theory of Computer Science, pp. 187-198, Feb. 2006.

Reicherdt, Robert, et al., "Slicing MATLAB Simulink Models," ICSE 2012, Proceedings of the 34th International Conference on Software Engineering, Zurich, Switzerland, IEEE, Jun. 2-9, 2012, pp. 551-561.

Aldrich, William, "Using Model Coverage Analysis to Improve the Controls Development Process," AIAA Modeling & Simulation Technologies Conference & Exhibit, Monterey, CA, Aug. 5-8, 2002, pp. 1-11.

Kanade, Aditya, et al., "Generating and Analyzing Symbolic Traces of Simulink/Stateflow Models," Springer-Verlag Berlin Heidelberg, Proceedings of 21$^{st}$ International Conference on Computer Aided Verification, CAV 2009, available from <https://link.springer.com/chapter/10.1007/978-3-642-02658-4 33>, Jun. 26-Jul. 2, 2009, pp. 430-445.

Kwiatkowski, et al., "Automated Generation and Assessment of Affine LPV Models" Proceedings of the 45th IEEE Conference on Decision & Control, Manchester Grand Hyatt Hotel, San Diego, CA, USA, Dec. 13-15, 2006, 6 pages.

"hinfnorm" Documentation Fact Sheet, MATLAB, The MathWorks, Inc., found online at <http://www.mathworks.com/help/robust/ref/hinfnorm.html?s_tid=gn_loc_drop&requestedDomain=www.mathworks.com>, Introduced in R2013B, retrieved from the internet Sep. 12, 2016, 3 pages.

"Model Reduction" Documentation Fact Sheet, MATLAB, The MathWorks, Inc., found online at <http://www.mathworks.com/help/control/model-simplification-1.html>, R2016B, retrieved from the internet Sep. 12, 2016, 1 page.

"LPV Approximation of a Boost Converter Model" Documentation Fact Sheet, MATLAB, The MathWorks, Inc., found online at <http://www.mathworks.com/help/slcontrol/examples/lpv-approximation-of-a-boost-converter-model.html?searchHighlight=LPV>, R2016B, retrieved from the internet Sep. 12, 2016, 11 pages.

Hyde, R. A., et al., "Fostering Innovation in Design and Reducing Implementation Costs by Using Graphical Tools for Functional Specification," American Institute of Aeronautics and Astronautics, Inc., The MathWorks Ltd, Aug. 2002, pp. 1-10.

Li, Dongguang, et al., "Analysis of Dual-Rate Inferential Control Systems," Brief Paper, Elsevier Science Ltd, Pergamon, Automatica, vol. 38, Issue 6, Jun. 2002, pp. 1053-1059.

(56) References Cited

OTHER PUBLICATIONS

Young, Nicholas, An Introduction to Hilbert Space: Chapter 2-Normed Spaces,' Cambridge Mathematical Textbooks, ISBN 0-521-33717-8, Cambridge University Press, Cambridge, Great Britain, 1988, pp. 13-20.

Zhou, Kemin, et al., "Robust and Optimal Control: Chapter 7-Model Reduction by Balanced Truncation," Prentice Hall, Englewood Cliffs, New Jersey, ISBN 0-13-456567-3, 1996, pp. 153-168.

Mohapatra, Durga Prasad, et al., "An overview of Slicing Techniques for Object-Oriented Programs," The Slovene Society Informatika, Ljubljana, Slovenia, Informatica, vol. 30, No. 2, Jun. 2, 2006, pp. 253-277.

U.S. Appl. No. 14/958,726, filed Dec. 3, 2015 by Fu Zhang et al. for a Model Structure Analysis With Integration of Transformed Slice, pp. 1-91.

Yang, Guowei, et al., "Memoized Symbolic Execution," ACM, Proceedings of the 2012 International Symposium on Software Testing and Analysis, ISSTA '12, Minneapolis, MN, USA, Jul. 15-20, 2012, pp. 144-154.

"Coupling (computing programming)," Wikipedia, retrieved from <https://en.wikipedia.org/wiki/Coupling_(computer_programming)>, retrieved on Sep. 1, 2018, pp. 1-5.

Daoudi, M., "An Investigation Into a Probabilistic Framework for Studying Symbolic Execution Based Program Conditioning," Thesis, Department of Computing, Goldsmiths College, University of London, 2006, pp. 1-132.

Harman, M., et al., "Pre/Post Conditioned Slicing," IEEE Computer Society, Proceedings of the IEEE International Conference on Software Maintenance (ICSM'01), Nov. 7-9, 2001, pp. 1-10.

Silva, Josep, "A Vocabulary of Program Slicing-Based Techniques," ACM, ACM Computing Surveys, vol. 44, No. 3, Article 12, Jun. 2012, pp. 1-41.

Xu, Baowen, et al. "A Brief Survey of Program Slicing," ACM SIGSOFT Software Engineering Notes, vol. 30, No. 2, Mar. 2005, pp. 1-36.

Zanden, B., et al., "An Explanation-Based, Visual Debugger for One-Way Constraints," ACM, Proceedings of the 17th Annual ACM Symp. on User Interface Software & Tech. (UIST'04), Santa Fe, New Mexico, USA, vol. 6, Issue 2, available from <https://dl.acm.org/citation.cfm?id=1029670>, Oct. 24-27, 2004, pp. 207-216.

Tarjan, Robert, "Depth-First Search and Linear Graph Algorithms" Siam J. Comput., vol. 1, No. 2, Jun. 1972 available at http://langevin.univ-tln.fr/cours/PAA/extra/Tarjan-1972.pdf, pp. 146-160.

Karatoprak, Yusuf, "Difference Between loose Coupling and Tight Coupling," available at https://www.c-sharpcorner.com/UploadFile/yusufkaratoprak/difference-between-loose-coupling-and-tight-coupling/, Dec. 21, 2012, pp. 1-9.

Herzner, W., et al., "Model-based Development of Distributed Embedded Real-Time Systems iwth the DECOS Tool-Chain" SAE Int'l (2007) available from <http://saemobilus.sae.org/content/2007-01-3827> (year: 2007).

* cited by examiner

ANALYZING MODEL BASED ON DESIGN INTEREST

RELATED APPLICATIONS

This application is a continuation-in-part of U.S. patent application Ser. No. 13/117,936, filed May 27, 2011, which claims priority to U.S. Provisional Patent Application No. 61/348,969, filed May 27, 2010, the disclosures of which are incorporated herein by reference.

DETAILED DESCRIPTION

The following detailed description of example implementations refers to the accompanying drawings. The same reference numbers in different drawings may identify the same or similar elements.

A computer generated model having executable semantics may be used to simulate the behavior of a physical system. A user may analyze the model to better understand the existing design of the physical system and/or to determine ways to improve a particular behavior of the physical system (e.g., improve efficiency). Based on the analysis, the user may attempt to identify components of the model that may affect the particular behavior. The user may generate a design model that includes the identified components and is used to determine design changes for improving the particular behavior of the physical system.

As more and more changes are made to the physical system over time, the model used to simulate the physical system may become larger and more complex making it more difficult and/or time consuming for the user to identify components of the model affecting the particular behavior of the physical system. Systems and/or methods described herein may automatically identify components of a model affecting a particular behavior of a physical system represented by the model thereby decreasing the time and effort required to implement design changes for improving the physical system.

In some implementations, the systems and/or methods may generate a model slice based on the components of the model affecting the particular behavior of the physical system represented by the model. The model slice may be a simplified model relative to the model of the physical system. Under a given set of constraints, the model slice may be an approximate bisimulation (e.g., exhibit a same particular behavior) as the model of the physical system.

Figure 1A:
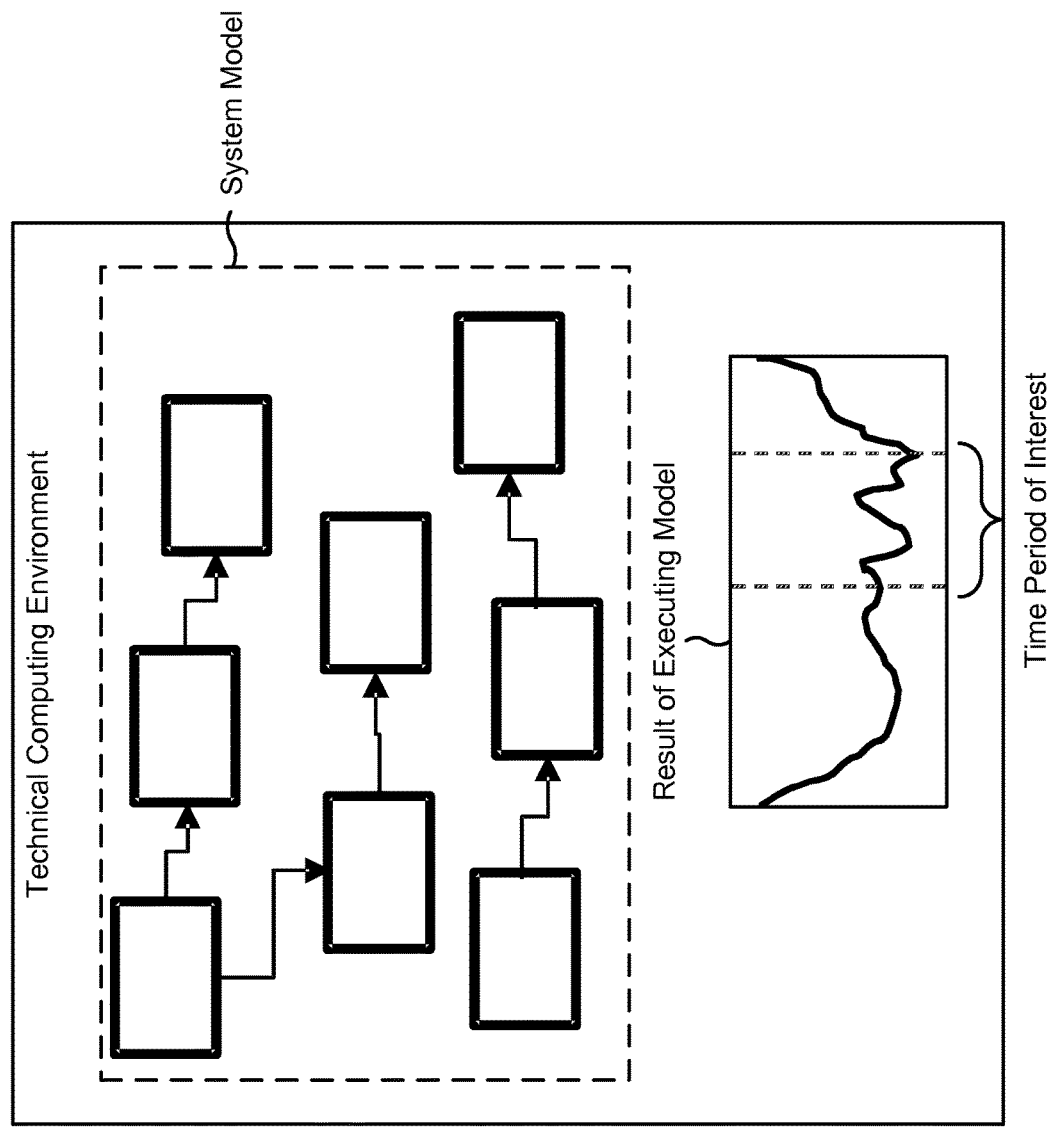
FIGS. 1A and 1B are diagrams illustrating an overview of an example implementation described herein.
Figure 1B:
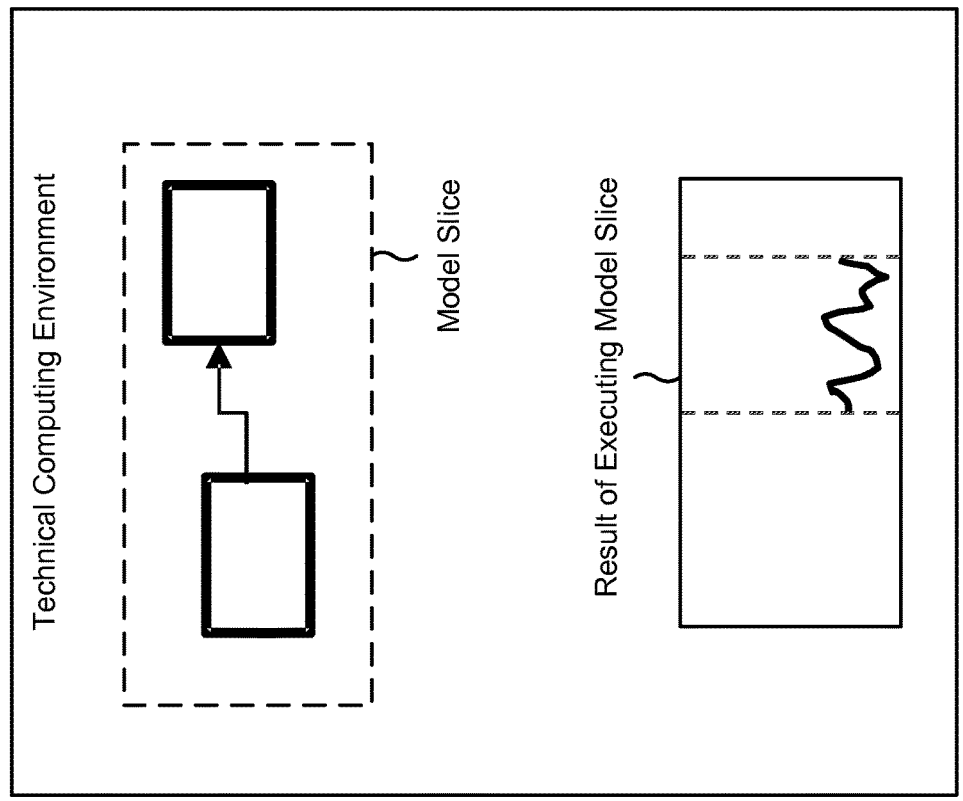

FIGS. 1A and 1B are diagrams illustrating an overview 100 of an example implementation described herein. For overview 100, assume that a user generates a model of a physical system ("System Model") and simulates the behavior of the system by executing the model in a technical computing environment. Further, assume that the technical computing environment provides, for display, a representation of the model along with a result of executing the model. Further, assume that, based on the result, the user has determined that the system model exhibits an undesired behavior for a specific simulation scenario during a particular period of time. Further, assume that the user has indicated that the user is interested in a behavior of the model during the particular period of time. As shown in FIG. 1A, the technical computing environment may display lines across a signal output by the model. The displayed lines may correspond to the particular period of time indicated by the user.

Referring now to FIG. 1B, the technical computing environment may determine model elements that are active during the particular period of time and may generate a model slice for the model. The model slice may only include model elements that are active during the particular period of time and, when executed, may exhibit the same behavior exhibited by the model during the particular period of time. As shown in FIG. 1B, the technical computing environment provides, for display, the model slice along with a result of executing the model slice. The model slice exhibits the same behavior as the model during the particular period of time.

Figure 2:
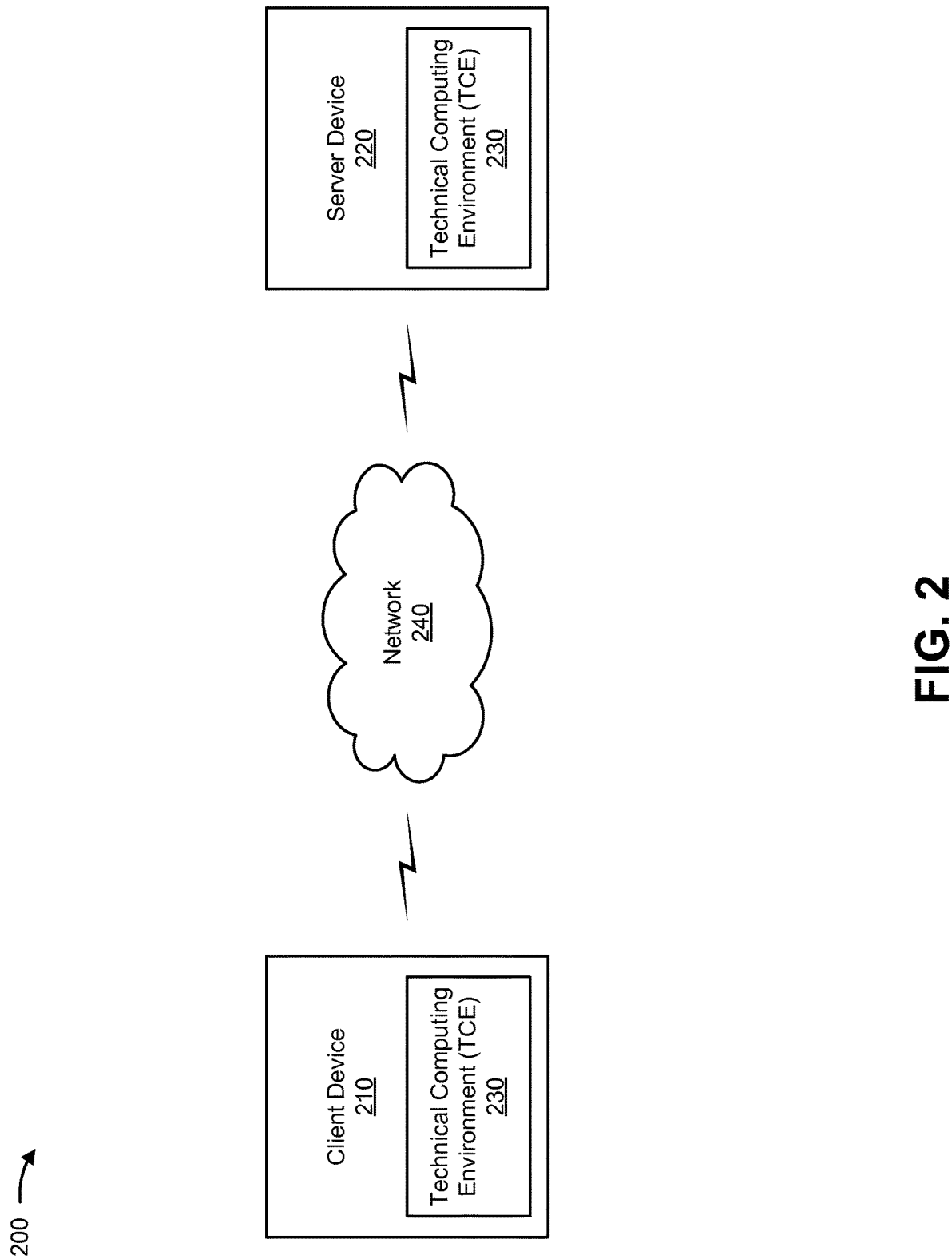
FIG. 2 is a diagram illustrating an example environment in which systems and/or methods described herein may be implemented.

FIG. 2 is a diagram of an example environment 200 in which systems and/or methods described herein may be implemented. As illustrated, environment 200 may include a client device 210 interconnected with a server device 220 via a network 240. Components of environment 200 may interconnect via wired and/or wireless connections.

Client device 210 may include one or more devices that are capable of identifying components of a model that affect a particular behavior of a physical system represented by the model. For example, client device 210 may include a laptop computer, a personal computer, a tablet computer, a desktop computer, a workstation computer, a smart phone, a personal digital assistant (PDA), and/or other computation and communication devices. In some implementations, client device 210 may include a technical computing environment (TCE) 230, which is described in greater detail below.

Server device 220 may include one or more server devices, or other types of computation and communication devices, that gather, process, and/or provide information in a manner described herein. Server device 220 may include a device that is capable of communicating with client device 210 (e.g., via network 240). For example, server device 220 may include one or more laptop computers, personal computers, workstation computers, servers, central processing units (CPUs), graphical processing units (GPUs), application-specific integrated circuits (ASICs), field-programmable gate arrays (FPGAs), etc. In some implementations, server device 220 may include TCE 230 and may perform some or all of the functionality described herein for client device 210. In some implementations, server device 220 may be omitted and client device 210 may perform all of the functionality described herein.

TCE 230 may be provided within a computer-readable medium of client device 210. Alternatively, or additionally, TCE 230 may be provided in another device (e.g., server device 220) that is accessible by client device 210. TCE 230 may include hardware or a combination of hardware and software that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In some implementations, TCE 230 may include a dynamically-typed programming language (e.g., the M language, a MATLAB® language, a MATLAB-compatible language, a MATLAB-like language, etc.) that can be used to express problems and/or solutions in mathematical notations.

For example, TCE 230 may use an array as a basic element, where the array may not require dimensioning. These arrays may be used to support array-based programming where an operation may apply to an entire set of values included in the arrays. Array-based programming may allow array-based operations to be treated as high-level programming that may allow, for example, operations to be performed on entire aggregations of data without having to resort to explicit loops of individual non-array operations. In some implementations, TCE 230 may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

TCE 230 may further provide mathematical functions and/or graphical tools (e.g., for creating plots, surfaces, images, volumetric representations, etc.). In some implementations, TCE 230 may provide these functions and/or tools using toolboxes (e.g., toolboxes for signal processing, image processing, data plotting, parallel processing, etc.). Alternatively, or additionally, TCE 230 may provide these functions as block sets or in another way, such as via a library, etc.

TCE 230 may be implemented as a text-based environment (e.g., MATLAB software; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.); a graphically-based environment (e.g., Simulink® software, Stateflow®software, SimEvents® software, Simscape™ software, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; aspects of a Unified Modeling Language (UML) or SysML environment; etc.); or another type of environment, such as a hybrid environment that includes one or more of the above-referenced text-based environments and one or more of the above-referenced graphically-based environments.

TCE 230 may include a programming language (e.g., the MATLAB language) that may be used to express problems and/or solutions in mathematical notations. The programming language may be dynamically typed and/or array-based. In a dynamically typed array-based computing language, data may be contained in arrays and data types of the data may be determined (e.g., assigned) at program execution time.

For example, suppose a program, written in a dynamically typed array-based computing language, includes the following statements:

A='hello'
A=int32([1, 2])
A=[1.1, 2.2, 3.3]

Now suppose the program is executed, for example, in a TCE, such as TCE 230. During run-time, when the statement "A='hello'" is executed the data type of variable "A" may be a string data type. Later when the statement "A=int32([1, 2])" is executed the data type of variable "A" may be a 1-by-2 array containing elements whose data type are 32 bit integers. Later, when the statement "A=[1.1, 2.2, 3.3]" is executed, since the language is dynamically typed, the data type of variable "A" may be changed from the above 1-by-2 array to a 1-by-3 array containing elements whose data types are floating point. As can be seen by this example, data in a program written in a dynamically typed array-based computing language may be contained in an array. Moreover, the data type of the data may be determined during execution of the program. Thus, in a dynamically type array-based computing language, data may be represented by arrays and data types of data may be determined at run-time.

TCE 230 may provide mathematical routines and a high-level programming language suitable for non-professional programmers and may provide graphical tools that may be used for creating plots, surfaces, images, volumetric representations, or other representations. TCE 230 may provide these routines and/or tools using toolboxes (e.g., toolboxes for signal processing, image processing, data plotting, parallel processing, etc.). TCE 230 may also provide these routines in other ways, such as, for example, via a library, local or remote database (e.g., a database operating in a computing cloud), remote procedure calls (RPCs), and/or an application programming interface (API). TCE 230 may be configured to improve runtime performance when performing computing operations. For example, TCE 230 may include a just-in-time (JIT) compiler.

Network 240 may include a network, such as a local area network (LAN), a wide area network (WAN), a metropolitan area network (MAN), a telephone network, such as the Public Switched Telephone Network (PSTN) or a cellular network, an intranet, the Internet, or a combination of these and/or other types of networks.

Although FIG. 2 shows example components of environment 200, in some implementations, environment 200 may include fewer components, different components, differently arranged components, and/or additional components than those depicted in FIG. 2.

Figure 3:
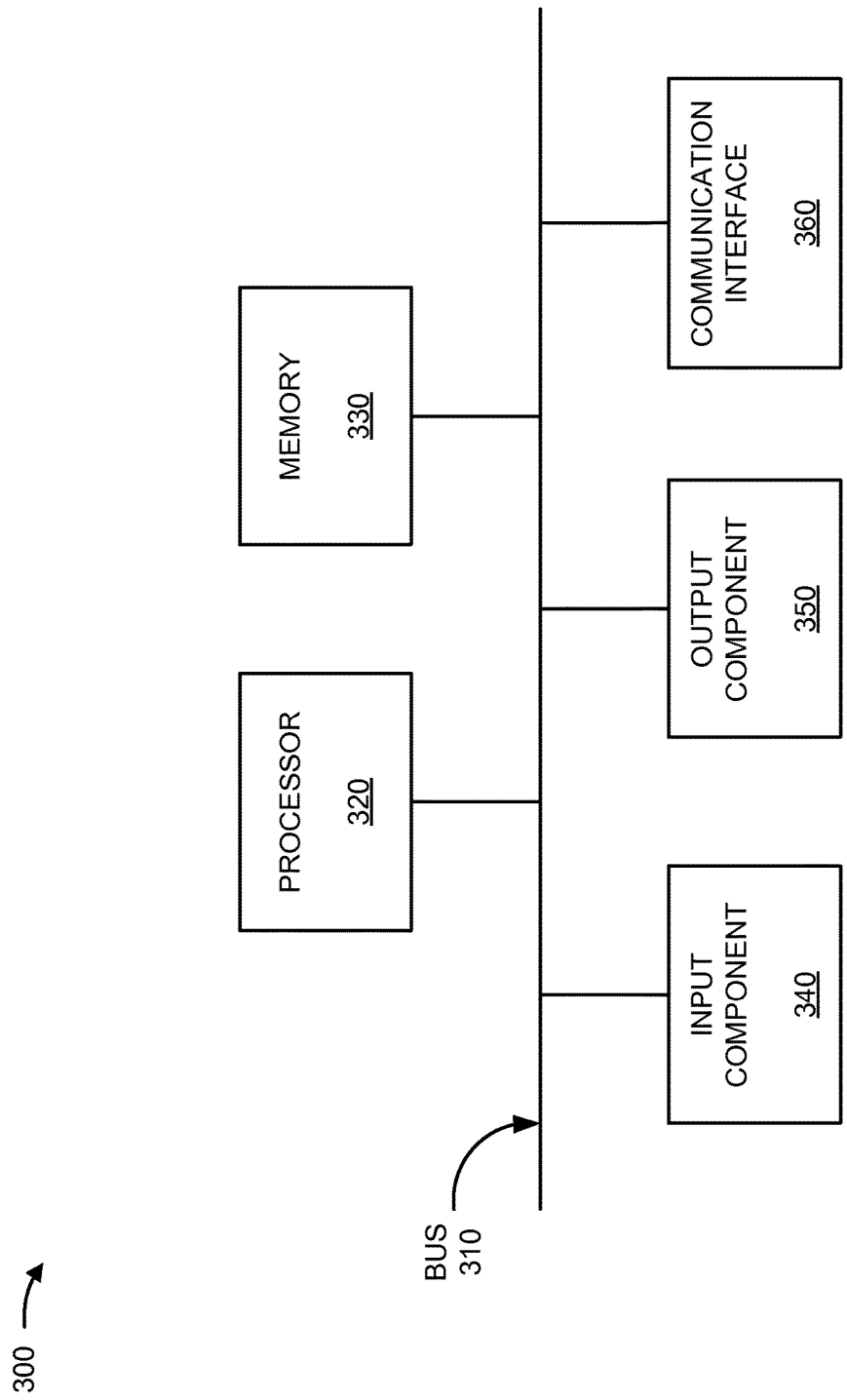
FIG. 3 is a diagram of example components of a device that may be used within the environment of FIG. 2 according to one or more implementations described herein.

FIG. 3 is a diagram of example components of a device 300. Device 300 may correspond to client device 210 and/or server device 220. Additionally, or alternatively, each of client device 210 and/or server device 220 may include one or more devices 300 and/or one or more components of device 300. As illustrated in FIG. 3, device 300 may include a bus 310, a processor 320, a memory 330, an input component 340, an output component 350, and a communication interface 360.

Bus 310 may include a path that permits communication among the components of device 300. Processor 320 may include a processor (e.g., a central processing unit, a graphics processing unit, an accelerated processing unit), a microprocessor, and/or any processing logic (e.g., a field-programmable gate array (FPGA), an application-specific integrated circuit (ASIC), etc.) that interprets and/or executes instructions. Memory 330 may include a random access memory (RAM), a read only memory (ROM), and/or another type of dynamic or static storage device (e.g., a flash, magnetic, or optical memory) that stores information and/or instructions for use by processor 320.

Input component 340 may include a component that permits a user to input information to device 300 (e.g., a touch screen display, a keyboard, a keypad, a mouse, a button, a camera, a microphone, a switch, etc.). Output component 350 may include a component that outputs information from device 300 (e.g., a display, an audio speaker, one or more light-emitting diodes (LEDs), etc.).

Communication interface 360 may include a transceiver-like component, such as a transceiver and/or a separate receiver and transmitter that enables device 300 to communicate with other devices, such as via a wired connection, a wireless connection, or a combination of wired and wireless connections. For example, a communication interface 360 may include an Ethernet interface, an optical interface, a coaxial interface, an infrared interface, a radio frequency (RF) interface, a universal serial bus (USB) interface, or the like.

Device 300 may perform various operations described herein. Device 300 may perform these operations in response to processor 320 executing software instructions included in a computer-readable medium, such as memory 330. A computer-readable medium may be defined as a non-transitory memory device. A memory device may include memory space within a single physical storage device or memory space spread across multiple physical storage devices.

Software instructions may be read into memory 330 from another computer-readable medium or from another device via communication interface 360. When executed, software instructions stored in memory 330 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number of components shown in FIG. 3 is provided for explanatory purposes. In practice, device 300 may include additional components, fewer components, different components, or differently arranged components than those shown in FIG. 3.

Figure 4:
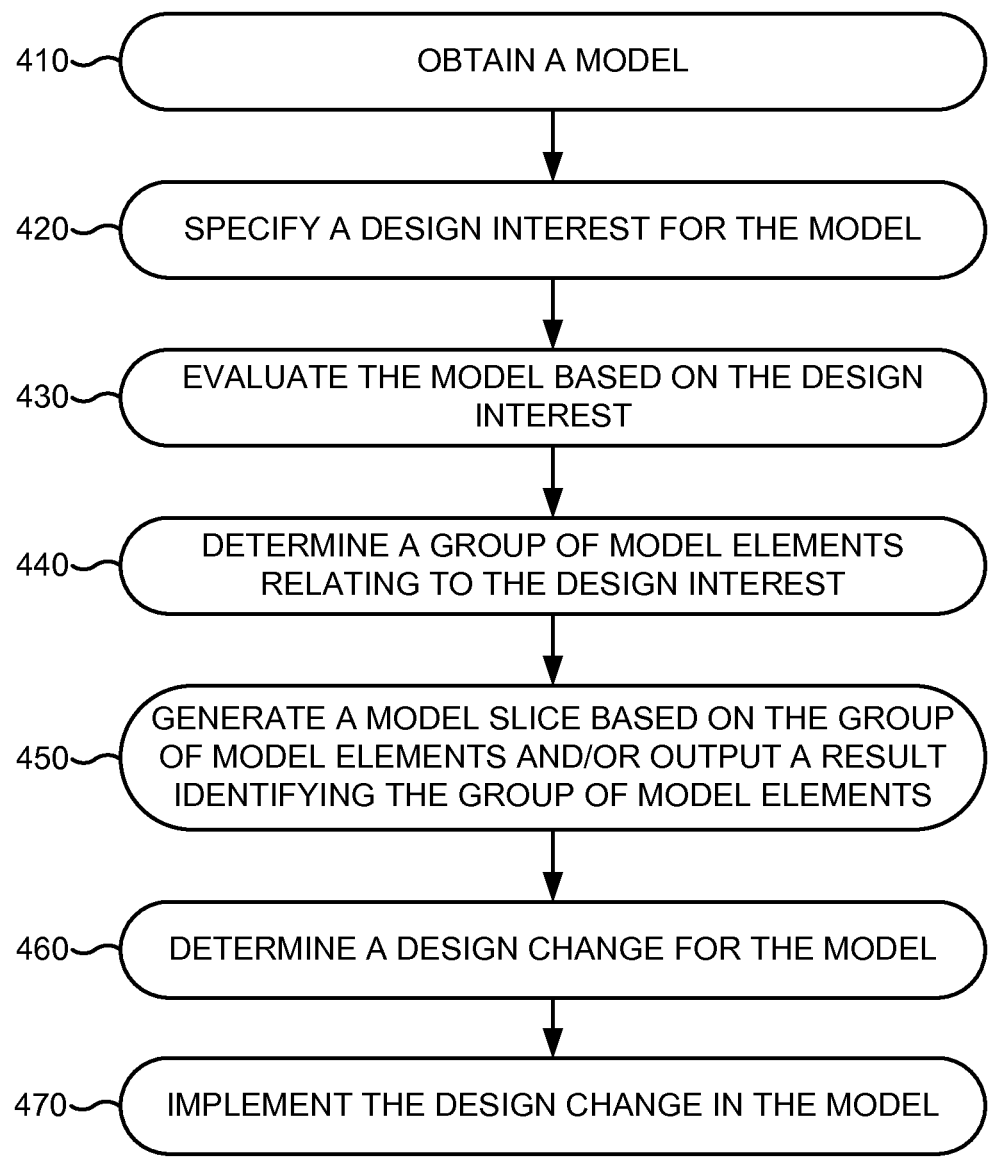
FIG. 4 is a flow chart of an example process for generating a model slice of a model.

FIG. 4 is a flow chart of an example process 400 for generating a model slice of a model. In some implementations, process 400 may be performed by client device 210 (e.g., TCE 230). In some implementations, one or more blocks of process 400 may be performed by one or more devices instead of, or possibly in conjunction with, client device 210.

As shown in FIG. 4, process 400 may include obtaining a model (block 410). For example, a user of client device 210, may generate a 2D representation and/or a spatial representation associated with one or more physical elements of a system. The user may cause the model to be stored in a memory. Client device 210 (e.g., TCE 230) may obtain the model from the memory.

Process 400 may include specifying a design interest for the model (block 420). For example, the model may include a group of model elements corresponding to the one or more physical elements of the system. A user, such as, for example, an engineer, may specify a design interest for generating a model slice of the model. The model slice may be a simplified model relative to the model and may exhibit a same set of behaviors as the model under an assumption of the slicing criteria. Client device 210 (e.g., TCE 230) may receive information identifying the design interest from the user.

In some implementations, client device 210 may provide the model, including the group of model elements, for display, via a user interface. The user may be interested in an operation of a particular model element included in the group of model elements. The user may interact with the user interface to designate the particular model element as a design interest for the model.

In some implementations, the design interest may include one or more constraints related to evaluating the model, such as, for example, performing a formal static analysis on the model. The constraint may limit or constrain an execution of the model and/or a performance of the formal static analysis. For example, the constraint may identify a time period during which the model is to be evaluated (e.g., the first 3 seconds, the last 5 seconds, from t=1 to t=5, a first time a model element is in a particular state until the model element leaves the particular state, a first time interval during which a particular signal (e.g. an enable signal) corresponds to true, etc.), constrain one or more inputs of the model (e.g., set an input to a particular value, limit the input to a particular range of values, etc.), constrain one or more outputs of the model, require a state of one or more model elements included in the model to remain constant, etc.

In some implementations, the design interest may identify a scope of analysis associated with evaluating the model. The scope of analysis may define a domain of interest associated with the design interest (e.g., a particular model element). For example, the design interest may identify a set of signals input to the model, a set of signals output by the model, a subsystem or a sub-model included in the model, a state of the model, a state event, a data store memory, a set of all zero-crossing events of a hybrid system model, etc.

In some implementations, the domain of interest may be defined as including model elements that contribute to overall dynamics of the model, model elements that do not contribute to the overall dynamics of the model, and/or signals of the model that are active under a particular constraint.

In some implementations, the domain of interest may be defined in terms of a subsystem and/or a sub-model of the model. For example, the design interest may indicate that all of the model elements included in a particular subsystem of the model are to be excluded from the evaluation of the model. In some implementations, the scope of analysis may indicate that the model is to be evaluated upstream and/or downstream with respect to a set of constraints.

As an example, assume that the particular model element has ten output ports and that the user is interested in a particular group of the ten output ports (e.g. the first five output ports). The design interest may identify the particular group of output ports and/or may identify a set of values to which the particular group of output ports are to be set.

In some implementations, information identifying one or more portions of the design interest may be provided via a user interface. For example, client device 210 may provide one or more portions of the model for display to the user. The user may select (e.g., using a mouse) a particular model element to be included in the design interest. In response to the selection of the particular model element, client device 210 may provide a user interface for providing information identifying one or more constraints and/or the one or more scopes of analysis.

Process 400 may include evaluating the model based the design interest (block 430). For example, client device 210

(e.g., TCE 230) may obtain the design interest and may identify a particular model element, a constraint, and/or a scope of analysis associated with evaluating the model. Client device 210 may evaluate the model by performing one or more different types of analysis of the model. In some implementations, the analysis may include a dependence analysis that determines a dependence between model elements. The dependence analysis may be based on the execution activities of the model elements. For example, a formal static analysis or a dynamic analysis may determine that a model element is in a particular state. The dependence analysis may analyze the model with the model element being held in the particular state.

In some implementations, the analysis of the model may include a dynamic analysis the model. The dynamic analysis may analyze dynamics of the model. Client device 210 may determine execution activities of the model elements based on the analysis. For example, the design interest may include a constraint that identifies a particular period of time (e.g., a first 3 seconds of an execution of the model, the last 5 seconds of an execution of the model, from t=1 to t=5 during an execution of the model, from a first time a model element is in a particular state until a time when the model element leaves the particular state, a time interval during which a particular signal (e.g. an enable signal) first corresponds to true, etc.). Client device 210 may execute the model and may collect coverage information for the model during the particular period of time. Client device 210 may determine a group of model elements that are in an active state and/or are required for evaluating the operation of the particular model element based on the coverage information.

In some implementations, the coverage information may include code coverage information. For example, each model element in the model may correspond to one or more code segments for executing the model element. Client device 210 may assemble the one or more code segments for each model element in an arrangement to allow the model to be executed. Client device 210 may execute the model based on the assembled arrangement of the one or more code segments. During the execution, client device 210 may determine whether a code segment has executed at least once during the particular period of time. Client device 210 may determine that a model element is in an active state during the particular period of time when a code segment associated with the model element is executed at least once during the particular period of time.

In some implementations, the coverage information may include model coverage information. For example, client device 210 may execute the model using test cases that were determined based the one or more constraints and/or the one or more scopes of analysis. For example, the design interest may identify a set of input values that may be received by the model during a particular period of time. Client device 210 may determine a test case based on the model receiving the set of input values during the particular period of time. Client device 210 may use the test case during execution of the model and may collect model coverage information during the particular period of time.

In some implementations, the model coverage information may include one or more input values, one or more output values, one or more state charts, etc. resulting from the model receiving the set of input values during the particular period of time and generating output values based on the set of input values. Client device 210 may determine that a model element is in an active state during the particular period of time based on an input value, an output value, a state chart, etc. collected for the model element. For example, client device 210 may determine that a value of the output for the model element is greater than zero. Client device 210 may determine that the model element is in the active state based on the value of the output being greater than zero.

Additionally, or alternatively, client device 210 may perform a formal static analysis of the model. In some implementations, in those instances where client device 210 performs the dynamic analysis of the model, client device 210 may perform the formal static analysis of the model prior to performing the dynamic analysis of the model or after performing the dynamic analysis of the model. Thus, client device 210 may perform a dynamic analysis of the model, a formal static analysis of the model, a dynamic analysis followed by a formal static analysis of the model, or a formal static analysis followed by a dynamic analysis of the model.

In some implementations, in those instances when the formal static analysis is to be performed, client device 210 may perform the formal static analysis using formal methods, such as, for example, model checking and/or abstract interpretation. In some implementations, client device 210 may determine, based on the design interest, one or more constraints on a state of the model, one or more constraints on an input received by the model, and/or one or more scopes of analysis related to the formal static analysis. Client device 210 may perform the formal static analysis based on the one or more constraints on the state of the model, the one or more constraints on the input, and/or the one or more scopes of analysis. In some implementations, the one or more constraints on the state of the model, the one or more constraints on the input, and/or the one or more scopes of analysis may correspond to one or more test cases for analyzing a particular behavior of the model.

In some implementations, the design interest may identify a state value constraint. The state value constraint may identify one or more elements of the model that are to be held in a particular state (e.g., active or inactive). For example, the model may include a group of model elements corresponding to a transmission system of a vehicle. The state value constraint may specify that the transmission system is to be in a particular gear (e.g., third gear). Client device 210 may perform the formal static analysis of the model with the transmission system (e.g., the group of model elements) held in the particular gear.

In some implementations, the design interest may identify a signal value constraint. The signal value constraint may identify one or more input values and/or one or more output values to be applied to an input and/or an output of one or more model elements. For example, the design interest may include a constraint that specifies that an output of a model element is set to a particular value. Client device 210 may set the output of the model element to the particular value and may perform the formal static analysis of the model.

As an example, assume that the model includes a logic block and that an output of the logic block may be a signal corresponding to True or a signal corresponding to False. The constraint may require that the output of the logic block be set to the signal corresponding to True during the execution of the model. Client device 210 may set the output of the logic block to output the signal corresponding to True and may perform the formal static analysis of the model.

In some implementations, the design interest may identify a frequency constraint. The frequency constraint may specify a frequency of one or more input values and/or one or more output values to be applied to an input and/or an output of one or more model elements. For example, the design interest may include a constraint that specifies that an input signal received by a model element is a sinusoidal signal with a frequency of 20 Hz, a sinusoidal signal with a frequency of less than 10 kHz, etc. Client device 210 may set the input signal based on the frequency constraint and may perform the formal static analysis of the model.

In some implementations, the formal static analysis may include compiling one or more portions of the model and/or generating one or more in-memory representations of the model. For example, client device 210 may generate one or more intermediate representations (IRs) associated with the model. In some implementations, client device 210 may generate an IR of the model and/or an IR of the one or more constraints. For example, client device 210 may generate an IR for the model that includes a group of nodes connected by one or more edges. The group of nodes may represent model elements included in the model. The one or more edges may represent one or more connections between the model elements in the model.

Client device 210 may analyze one or more decision points of the model (e.g., whether a switch block causes a signal to be passed to one portion of the model or to another portion of the model) based on the IR of the model. Client device 210 may identify the group of model elements that are in an active state and/or are required for evaluating the operation of the particular model element based on analyzing the decision points.

In some implementations, client device 210 may evaluate the decision points by following a flow of data backwards through the model to determine data dependencies between model elements included in the model and/or by propagating a signal value forward through the model. For example, the design interest may include a first signal value constraint that sets a value of an output included in the model to a first value and a second signal value constraint that sets a value of an input to a second value.

In some implementations, client device 210 may follow the flow of data backwards through the model by setting the output to the first value and identifying a model element connected to the output. Client device 210 may determine a data dependency between the output and the model element based on the model element being connected to the output. Client device 210 may continue to follow a flow of data backwards through the model in a similar manner.

In some implementations, client device 210 may propagate the first value forward through the model by setting the input to the second value. For example, client device 210 may determine that the input provides an input to a switch block included in the model. The switch block may provide a received input to a first model element when the received input is within a particular range of values and may provide the input to a second model element when the received input is not within the particular range of values.

By way of example, assume that client device 210 determines that the received input is within the range of values when the input is set to the second value. Client device 210 may determine that the switch block provides the received input to the first model element based on the received input being within the particular range of values. Client device 210 may determine that the first model element is in an active state and/or that the second model element is in an inactive state when the received input is within the range of values. Client device 210 may follow the flow of data forward through the model in a similar manner to identify model elements that are in an active state when the received input is within the range of values.

In some implementations, the IR of the model may include a design verifier intermediate representation (DVIR) and data structures used to determine dependencies of model elements. In some implementations, conditional regions in the model (e.g., an IF block, a switch, etc.) may be instrumented with check expressions. In some implementations, constraints included in the design interest may be incorporated as algebraic constraints of a state of the model and/or as input variables. The DVIR may then be analyzed to determine execution activities of regions and/or model elements of the model.

Process 400 may include determining a group of model elements relating to the design interest (block 440) and generating a model slice based on the group of model elements and/or outputting a result identifying the group of model elements (block 450). For example, client device 210 (e.g., TCE 230) may determine an execution status (e.g., enabled, disabled, triggered, not triggered, active, inactive, etc.) of the model elements included in the model. Client device 210 may identify one or more model elements that have an active status (e.g., enabled, triggered, active, etc.) when the model is evaluated with respect to the design interest. Client device 210 may generate the model slice based on the one or more model elements having the active status and/or may output a result identifying the one or more model elements having the active status.

In some implementations, the design interest may identify a set of signals associated with the scope of analysis. Client device 210 may identify one or more model elements that do not depend on the set of signals (e.g., one or more model elements that are inactive, disabled, not triggered, etc.). Client device 210 may determine that the identified one or more model elements are not related to the design interest and/or that a set of other model elements (e.g., model elements that depend on the set of signals) are related to the design interest. Client device 210 may generate the model slice based on the set of other model elements and/or may output a result identifying the set of other model elements.

In some implementations, client device 210 may determine the group of model elements based on code coverage information. For example, client device 210 may obtain code coverage information associated with performing the coverage analysis of the code generated for the model. Client device 210 may analyze the code coverage information to identify one or more code segments that executed at least once during the coverage analysis. The one or more code segments may implement one or more model elements included in the model. Client device 210 may determine that the one or more model elements were in an active state based on the one or more code segments executing at least once during the coverage analysis and, therefore, that the one or more model elements are related to the design interest. Client device 210 may generate the model slice based on the one or more model elements being in the active state and/or may output a result identifying the one or more model elements in the active state.

In some implementations, client device 210 may determine the group of model elements based on model coverage information. For example, client device 210 may obtain model coverage information determined based on executing the model. The model coverage information may include information relating to signals received and/or output by one or more model elements included in the model. For example, the model may include a switch block that provides an output to a first portion of the model when an input to the switch block is less than a particular value and provides an output to a second portion of the model when the input is greater than or equal to the particular value. Based on the model coverage information, client device 210 may determine that, during the particular time period, the input to the switch block is always greater than the particular value. Client device 210 may determine that the model elements included in the second portion of the model are in an active state during the particular time period and/or that model elements in the first portion of the model are not in an active state during the particular time period. Client device 210 may determine that the model elements in the second portion of the model are related to the design interest based on the model elements being in the active state during the particular time period. Client device 210 may generate the model slice based on the model elements in the second portion of the model and/or may output a result identifying the model elements in the second portion of the model.

In some implementations, client device 210 may determine the group of model elements related to the design interest based on performing the formal static analysis of the model. For example, client device 210 may obtain a result of performing the formal static analysis of the model based on the one or more constraints. The result may include information identifying a group of model elements that are in an active state based on applying the one or more constraints to the model. Client device 210 may determine that the group of model elements in the active state are related to the design interest. Client device 210 may generate the model slice based on the group of model elements being in the active state and/or may output a result identifying the group of model elements in the active state.

Client device 210 may define an execution graph for the model as EG=(S∪P, E) where V=S∪P is a set of vertices and another set of vertices partitioned as a set of signal vertices S and a set of procedure vertices P, and E⊆V×V is a set of edges. In some implementations, the procedures in the execution graph correspond to blocks of statements. The execution graph may be a hybrid directed graph that captures both variable dependence and procedure dependence. For example, for the execution graph EG=(V, E) and a vertex v, client device 210 may define a vertex elimination graph as:

$$EG\backslash v = (V\backslash v, E \cup \{(x,y) | x \to v \text{ and } v \to y\} \setminus \{(x,v) | x \to v\} \setminus \{(v, y) | v \to y\}),$$

where \ is the standard set difference operation for the set of vertices and edges. In some implementations, client device 210 may determine a relationship between execution context of non-virtual subsystems included in the model. In some implementations, client device 210 may determine the execution context based on an execution tree (e.g., a program structure tree). Client device 210 may determine that an execution tree T=(V, E) is an undirected graph that is a rooted tree based on the execution tree satisfying certain criteria, such as, for example, T is connected, T has no cycles, and T has a unique node r called the root.

In some implementations, client device 210 may determine that a dynamic analysis structure for the execution tree is a four-tuple (EG, T, f) with an execution graph EG=$S_g \cup P_g$, $E_g$), an execution tree T=($V_T$, $E_T$), and two maps that associate the graph procedure vertices with tree nodes: f: $P_g \to V_T$ may associate an execution tree node with every procedure node in the execution graph; and $f^{-1}$: $V_T \to P_g \cup p_0$ may associate a procedure in the execution graph with a node in the execution tree. For tree nodes that do not have an associated procedure vertex, client device 210 may map the tree node to a special vertex $p_0$.

In some implementations, the model may be associated with a conditional execution context (CEC) tree (e.g., a unique rooted execution tree). Every leaf node in the CEC tree may be associated with a non-virtual model element of the model and every non-leaf node in the CEC tree may be associated with a non-virtual subsystem in the model. For a non-virtual model element, the maps f(v) and $f^{-1}$(t) may associate the execution graph node with an execution tree node that correspond to that non-virtual model element.

In some implementations, the model may be associated with a program structure tree (PST). The leaf nodes in the PST may be basic regions in the model and the non-leaf nodes may be other regions in the model. Each region may have an associated tree node in the execution tree. Each basic region may have an associated vertex in the execution graph. The map f(v) may associate the vertex in the execution graph with a corresponding node in the execution tree. The map $f^{-1}$(v) may map all tree nodes of the basic regions with a corresponding vertex in the execution graph and may map all tree nodes of the other regions to $v_0$.

In some implementations, client device 210 may determine that a rooted tree imposes a partial order on the nodes in the execution tree. A node u is less than, or equal to Tv if, and only if, the unique path from the root to v passes through u. Client device 210 may determine that the node u dominates v if u is less than, or equal to Tv The dominance relationship of the CEC tree may determine execution activities of procedures of non-virtual model elements included in the model. For example, if a subsystem associated with a non-leaf node u is disabled, client device 210 may determine that all procedures associated with descendant nodes of the non-leaf node u are disabled. In these instances, client device 210 may determine that the data dependency at the inactive procedures are also inactive and may use a disabled value of the subsystem instead of an output value of the subsystem (e.g., a result corresponding to the inactive model elements being disconnected from an output signal of the inactive model elements in the execution graph). Client device 210 may determine an active set of model elements and a dependent set of model elements based on the execution tree and/or the execution graph for the model and may implement a mapping of a simulation state for the model as a straightforward projection of a complete simulation state of the model to simulation states of the active and dependent model elements.

In some implementations, because a simulation state is dependent upon execution, a variable that is a simulation state variable in the model may become a non-state variable in the model slice. For example, client device 210 may determine that a subsystem in the model is disabled. Client device 210 may determine that an output value for the subsystem is a constant value based on the subsystem being disabled. Client device 210 may remove the subsystem when generating the model slice and may replace a signal output of the subsystem with a constant block having a value that is set at an initial output of the subsystem.

The following is an example of pseudo-code for analyzing a semantic model to generate a model slice based on an execution tree and an execution graph for the model:

```
function [activeBlk, activeSignal] = analyze_dependence (mdl, cvd, start)
    g = create_execution_graph (mdl);
    t = create_CEC_tree (mdl);
    act = analyze_execution_activity (mdl, cvd, t);
    % Map nodes from CEC tree to execution graph.
    inactive = create_inactive_set (act);
    % Stop searching when inactive procedures are encountered.
    [activeBlk, activeSignal] = reachability (g, start, inactive);
end.
```

In some implementations, client device 210 may generate a model slice that, when executed, may cause the particular model elements identified in the design interest to exhibit a same behavior as exhibited by the particular model elements during an execution of the model (e.g., the model slice may approximate simulation semantics of the model with respect to the design interest).

In some implementations, client device 210 may determine a set of model transformation rules for generating the model slice. Client device 210 may perform graphical transformations on the model to generate the model slice. In some implementations, the transformation rules may provide analysis for performing coverage-based model slicing. For example, a pre-dependence analysis may include parsing coverage data determined by performing a dynamic analysis of the model and extracting information regarding execution activities of the model elements. The information regarding the execution activities may be used in the dependence analysis of the model.

A post-dependence analysis may be performed after the dependence analysis. The post-dependence analysis may be used for transformations involving a Merge block and/or another type of memory layout model element.

In some implementations, the transformation rules may incorporate semantic information, such as, for example, model coverage data, into the analysis and/or transformation of the model. Table 1, below, provides example methods that may be used by client device 210 to generate the model slice.

TABLE 1

| Method | Description |
| --- | --- |
| Applicable | Analyze an execution graph connection pattern of an execution graph generated for the model. Determine whether a transformation rule applies based on analyzing the execution graph connection pattern. |
| Analyze | Perform a pre-dependence analysis. Extract activity data from coverage information determined for the model. Determine active and/or inactive model elements based on the coverage information. |
| PostTransform | Perform a post-dependence analysis. Use dependence information to analyze the model. Determine graphical transformation actions for transforming one or more model elements based on the analysis. |
| Transform | Perform the determined graphical transformation actions on the model to generate the model slice. |

Referring to Table 1, the method Applicable may perform an analysis loop over non-virtual model elements included in the model and may determine whether a transformation rule is applicable with respect to each of the non-virtual elements. When the transformation rule is applicable, the method Applicable may invoke the method Analyze.

The method Analyze may analyze the coverage data and may extract information associated with an execution activity for the model. Applicable model elements may be analyzed based on the transformation rules. The analysis may be local. For example, for a model element that controls an execution of other model elements, the analysis may only return execution activity information associated with execution contexts controlled by the model element. The execution activity information may not propagate to execution contexts that are descendents of the execution context. As an example, assume that a subsystem of the model is determined to be inactive. Each child subsystem within the subsystem may be determined to be inactive.

The PostTransform method may analyze post-compile virtual model elements, such as, for example, a Merge block, a Concatenate block, etc., included in the model. The post-compile virtual model elements may be model elements that do not have associated execution procedures. The post-compile virtual model elements may define signal buffers that are shared among signal resources of the model elements. Client device 210 may perform a localized analysis using a result of the dependency analysis to determine whether only one of the signal resources of the model element is active. When only one of the signal resources is active, client device 210 may determine that data sharing is not required and may remove the post-compile virtual block from the model. Client device 210 may directly connect the active signal resource and a signal destination of the active signal resource based on removing the post-compile virtual block from the model.

Table 2, below, provides an example set of transformation rules that may be used by client device 210 to perform graphical transformations on the model.

TABLE 2

| Rule | Condition | Transformation |
| --- | --- | --- |
| Inactive-if | A branch of an If block is never taken | Remove a subsystem connected to the inactive branch of the If block |
| Redundant-if | A branch of an If block is always taken | Remove the If block and remove the If port of the subsystem |
| Inactive-switch | A branch of a Switch block is never active | Disconnect the inactive branch of the Switch block |
| Redundant-switch | One input of a Switch block is always taken | Remove the Switch block and connect an input of the Switch block to an output of the Switch block |
| Redundant-merge | One of the data sources of a Merge block is active (post-dependence analysis) | Remove the Merge block and connect an input of the Merge block to an output of the Merge block |
| Inactive-enable | Enable signal is never true | Remove a subsystem associated with the enable port |
| Inactive-trigger | Trigger signal is never active | Remove a subsystem associated with the trigger port |

The following is an example of pseudo-code for performing a pre-dependence analysis:

```
function [activeBlk, activeSignal] = analyze_execution_activity (mdl, t)
    % Loop over the model hierarchy.
    allActivity = [ ]
    for treeNode = t
        for rule = rules
            if rule.applicable (treeNode)
                % Apply analysis rule
                activity = rule.analyze (treeNode);
                allActivity (end+1) = activity;
            end
        end
    end
    % Remove redundancy, propagate activity in model hierarchy.
    [activeBlk, activeSignal] = postProcess (allActivity);
end.
```

The following is an example of pseudo-code of a procedure for generating a model slice based on performing a dynamic analysis of the model:

```
function mdl_slice = coverage_based_slicing (mdl, interests)
    cvd = simulate_and_collect_coverage(mdl);
    rules = create_model_transformation_rules(mdl);
    % Use the rules to analyze block activity.
    act =analyze_activity(mdl, rules, cvd);
    % Analyze model dependence.
    [activeBlk, activeSignal] = analyze_dependence(mdl, act, interests);
    %Transform model to generate model slice.
    mdl_slice = transform (mdl, activeBlk, activeSignal, rules);
end.
```

The following is an example of pseudo-code for generating a model slice based on performing a formal static analysis of the model:

```
function mdl_slice = formal_method_based_slicing (mdl, interests)
    ir = create_analysis_ir (mdl);
    rules = create_model_transformation_rules (mdl);
    % Use formal analysis engine to analyze activity.
    act =analyze_activity (mdl, ir);
    % Analyze model dependence.
    [activeBlk, activeSignal] = analyze_dependence (mdl, act, ir);
    % Transform model to generate model slice
    rules = create_model_transformation_rules (mdl)
    mdl_slice = transform (mdl, activeBlk, activeSignal, rules);
end.
```

The following is an example of pseudo-code for performing a graphical transformation of the model:

```
function new Mdl = create_slice (mdl, t, inactiveBlks, rules)
    % Preprocess.
    removeSynthesizedBlocks (inactiveBlks);
    to Remove = removeChildren (inactiveBlks);
    % Globally remove dead blocks.
    removeBlocks (toRemove)
    % Perform local graph transformations.
    for the rule = rules
        rule.transform (mdl);
    % Remove the graphical blocks.
    removeRedundantVirtualBlocks (mdl);
end.
```

In some implementations, the model slice may include all of the model elements included in the group of model elements related to the design interest. For example, client device 210 may identify model elements included in the model that are not included in the group of model elements. Client device 210 may remove the identified model elements from the model to generate the model slice.

In some implementations, the model slice may include a portion of the group of model elements, one or more additional model elements, and/or one or more different model elements. For example, the group of model elements may include a signal block that selectively provides an input to a first portion of the model or a second portion of the model. Client device 210 may determine that only the first portion of the model is not included in the group of model elements related to the design interest. Client device 210 may remove the signal block (e.g., replace the signal block with a signal line for providing the input to the first portion of the model) to generate the model slice based on only the first portion of the model being included in the group of model elements.

In some implementations, client device 210 may store information related to generating the model slice. The stored information may allow client device 210 to re-create the group of model elements related to the design interest, generate a related model slice based on changes to the design interest provided by the user, undo an action taken in response to an input received by a user (e.g., the user inadvertently provides an input to perform an action with respect to generating the model slice and wants to undo it), and/or re-create the original model for the system. Client device 210 may store information identifying each action performed when generating the model slice. The stored information may allow client device 210 to work backwards to undo one or more actions performed when generating the model slice. For example, client device 210 may store information identifying one or more model elements that are modified and/or removed from the group of model elements when generating the model slice.

In some implementations, client device 210 may provide information identifying differences between the model slice and the model. For example, client device 210 may provide a user interface that allows the user to view a list of model elements included in the model and/or a list of model elements included in the model slice. In some implementations, the user interface may display the list of model elements included in the model in conjunction with the list of model elements included in the model slice.

In some implementations, the user interface may list model elements, included in the group of model elements related to the design interest, that have been modified and/or are not included in the model slice and/or one or more additional model elements that are included in the model slice and are not included in the group of model elements and/or the model. For example, when generating the model slice, client device 210 may replace a switch block with a signal line. The user interface may provide a list that identifies the switch block as being included in the group of model elements, as not being included in the model slice, and/or as being replaced by the signal line.

In some implementations, client device 210 may provide information associated with executing and/or verifying the model slice. For example, client device 210 may execute the model slice and may compare a behavior of the particular model elements, in the model slice, during the execution of the model slice with a behavior of the particular model elements during an execution of the model. The information associated with executing and/or verifying the model slice may include information identifying any differences determined by client device 210 based on the comparison. In some implementations, the information associated with executing and/or verifying the model slice may include information identifying a numerical consistency associated with one or more outputs of the particular model elements in the model slice. For example, client device 210 may determine a value of an output of the particular model elements, in the model slice, during an execution of the model slice and may compare the value with a value of the output of the particular model elements during an execution of the model. The information associated with executing and/or verifying the model slice may include information identifying a result of the comparison (e.g., that the values were the same, a difference between the values, etc.).

Additionally, or alternatively to generating the model slice, client device 210 may output a result identifying the group of model elements. In some implementations, client device 210 (e.g., TCE 230) may provide a result that identifies each model element, included in the group of model elements, as being related to the design interest. For example, client device 210 may cause the model to be displayed via a display associated with client device 210. The displayed model may visually distinguish (e.g., highlight) the group of model elements related to the design interest from other model elements included in the model.

In some implementations, client device 210 may visually distinguish the group of model elements related to the design interest by highlighting and/or displaying model elements included in the group of model elements related to the design interest using a color that is different from a color used to display other model elements. Alternatively or additionally, client device 210 may use one or more animated graphical user interface (GUI) features, such as blinking lines, to visually distinguish model elements included in the group of model elements related to the design interest.

The following is an example of pseudo-code for highlighting the group of model elements related to the design interest:

```
function [gSrc, gDst] = get_graphcial_ports (srcP, dstP)
    % Create an intermediate representation for graph signal connection.
    g = create VirtualPortGraph (dstP);
    [srcV, dstV] = g.reachable (vId(srcP));
    gSrc = handles (srcV);
    gDst = handles (dstV);
end.
```

Process 400 may include determining a design change for the model (block 460). For example, a user, such as, for example, an engineer, may identify one or more modifications for the model based on a result of evaluating the model slice. In some implementations, the user may modify, add, and/or remove one or more model elements included in the model slice to form a modified model slice for implementing the design change. For example, the user may provide one or more inputs for causing one or more model elements, included in the model slice, to be modified and/or replaced. Client device 210 may modify and/or replace the one or more model elements to form the modified model slice.

In some implementations, the modified model slice may modify a behavior of the physical system corresponding to the model (e.g., correct an error, increase an efficiency of the system, etc.). For example, for a particular set of input values, an output of the particular model element may be outside a permissible range of values. The user may identify a model element, included in the model slice, affecting the output of the particular model element. The user may cause client device 210 to modify the identified model element within the model slice to cause the output of the particular model to be within the permissible range of values for the particular set of input values. Client device 210 may modify the identified model element to form the modified model slice.

In some implementations, client device 210 may validate and/or verify the modified model slice. For example, client device 210 may execute the modified model slice based on the particular set of input values. Based on the execution, client device 210 may determine that the modified model slice causes the output of the particular model element to be within the permissible range of values when the particular set of input values are provided to the model slice.

In some implementations, client device 210 may store information related to modifying the identified model element. The stored information may allow client device 210 to revert the model slice back to an original state (e.g., undo the modifications to the model element, replace the modified model element with an original form of the model element, etc.).

Process 400 may include implementing the design change in the model (block 470). For example, upon verifying and/or validating the model slice, a user, such as, for example, an engineer, may identify one or more modifications for implementing a design change in the model. In some implementations, the user may modify, add, and/or remove one or more model elements included in the model to implement the design change. For example, the user may provide one or more inputs for causing one or more model elements, included in the model, to be modified and/or replaced. Client device 210 may modify and/or replace the one or more model elements to implement the design change in the model.

In some implementations, client device 210 may replace a model element, included in the model, with a model element, included in the model slice, that was modified to form the modified model slice. Additionally, or alternatively, client device 210 may integrate the modified model slice into the model in another way.

In some implementations, the user may desire to verify and/or validate the modified model (e.g., the model including modified model element(s) from the modified model slice). For example, the user may identify a design interest for verifying and/or validating the modified model. In some implementations, the design interest may identify one or more different model elements, one or more different constraints, and/or one or more different scopes of analysis than included in the design interest used to generate the model slice used to generate the modified model. For example, the user may originally be concerned with improving an efficiency of the physical system and now may desire to verify certain characteristics of the physical system related to the physical system operating safely. In some implementations, client device 210 may receive the design interest and may generate a model slice as described in connection with blocks 420-460. Client device 210 may provide the model slice to the user to allow the user to verify and/or validate the modified model.

While FIG. 4 shows process 400 as including a particular quantity and arrangement of blocks, in some implementations, process 400 may include fewer blocks, additional blocks, or a different arrangement of blocks. Additionally, or alternatively, some of the blocks may be performed in parallel.

Figure 5A:
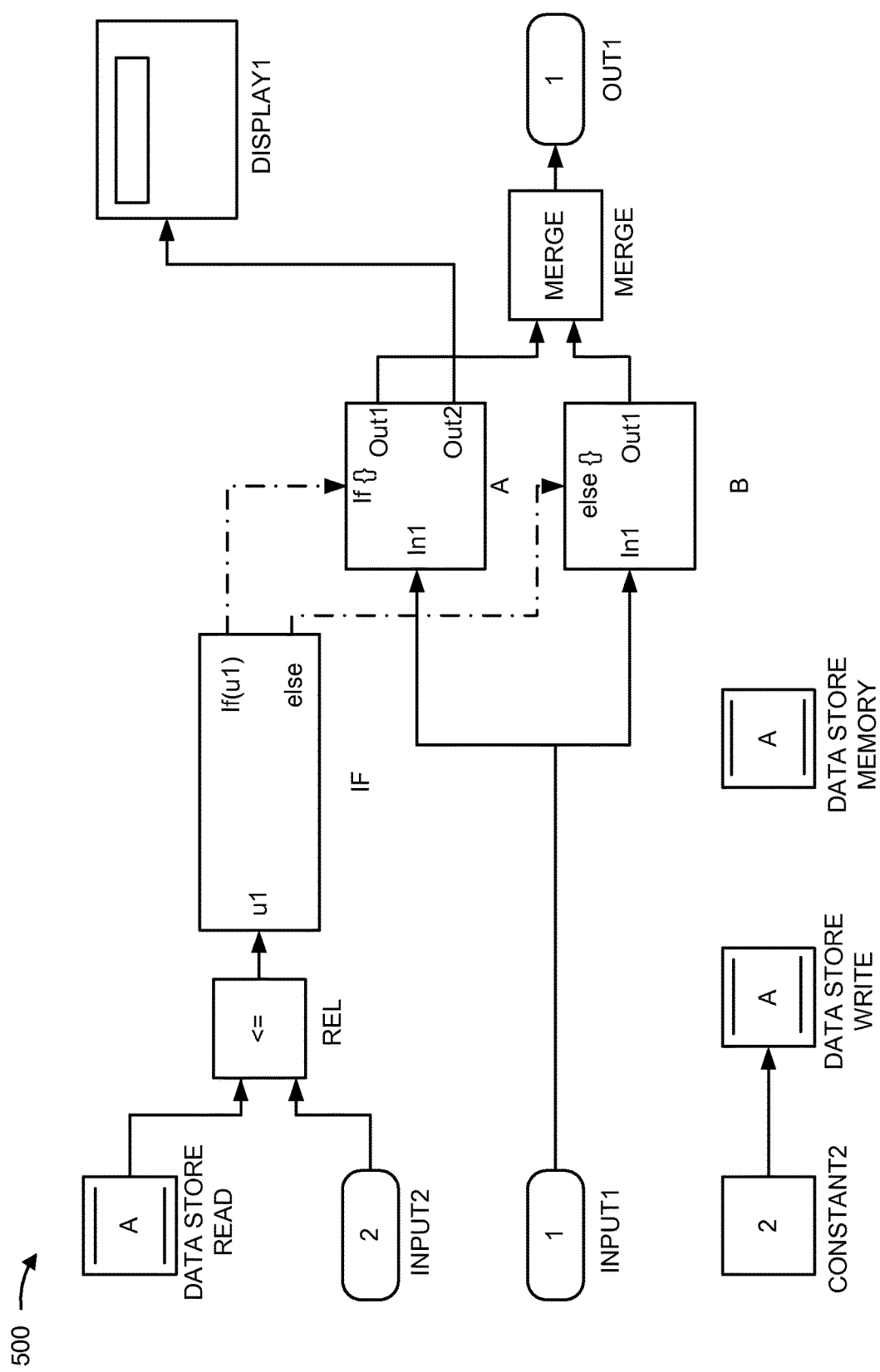
FIGS. 5A-5G, 6A-6C, and 7A-7E are diagrams of examples of the process described in connection with FIG. 4.

FIGS. 5A-5G are diagrams illustrating an example 500 of process 400 described in connection with FIG. 4. For example 500, assume that a user generates a model of a system via client device 210 and is interested in a behavior of an output of the model when a particular input is set to a particular value. Further, assume that the user has selected a particular menu item for displaying the model via a display associated with client device 210. Referring now to FIG. 5A, in response to the user selecting the particular menu item, client device 210 may cause the model to be displayed to the user via the display.

Figure 5B:

Referring to FIG. 5B, assume that the user has indicated that the user desires to provide information related to a design interest for the model (e.g., the user has selected a particular menu item) and that client device 210 has provided a user interface for providing information regarding the design interest. Further, assume that the user has provided information identifying a particular model element, a scope of analysis, and a constraint. As shown in FIG. 5B, the user has provided information indicating that the model should be evaluated to determine all active model elements associated with outputting a signal via Output1 when Input2 is set to 0.0. The user selects the option "Submit" to provide the information to client device 210.

Figure 5C:
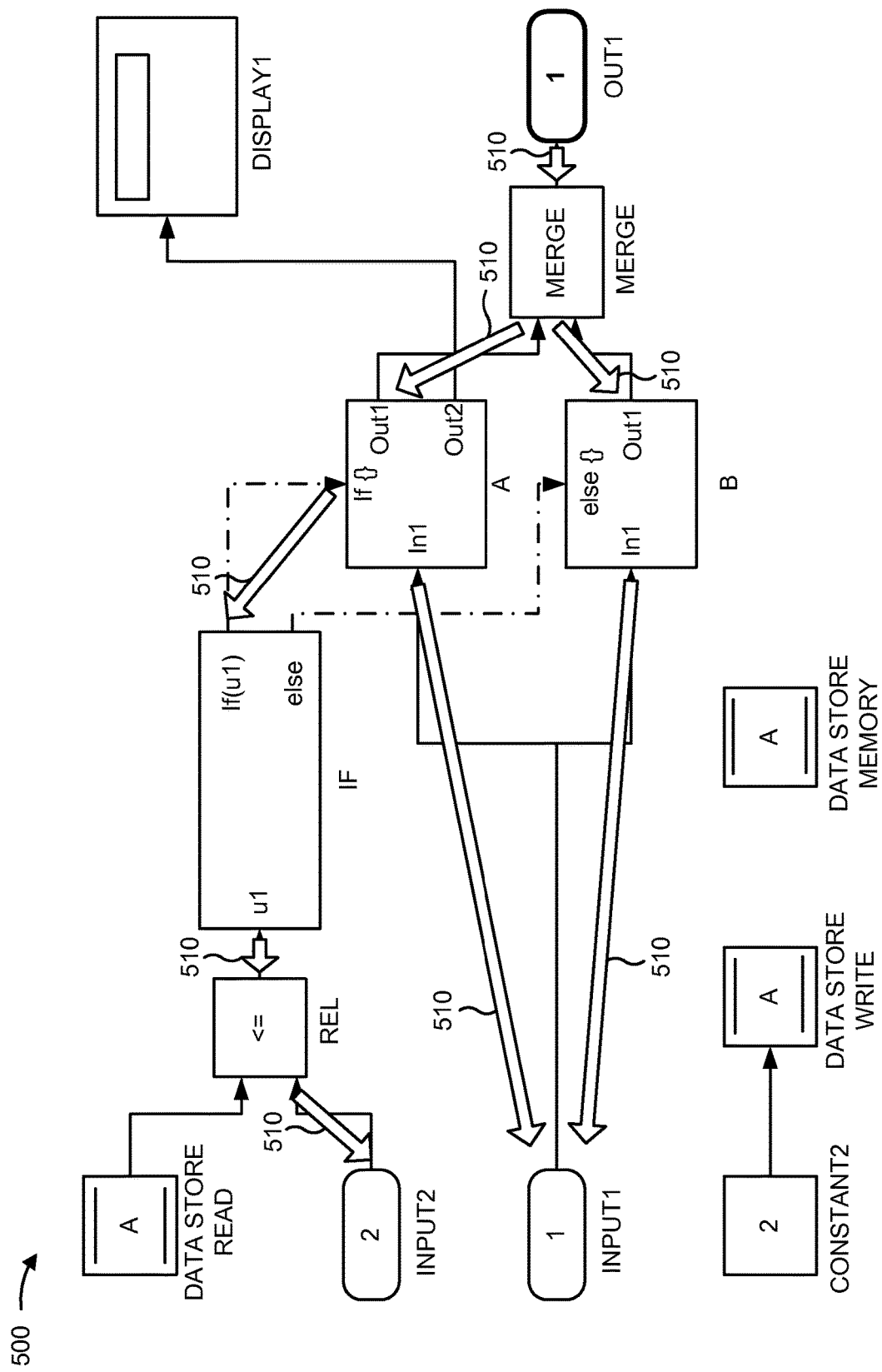

Referring to FIG. 5C, client device 210 may receive the information provided by the user. Based on the received information, client device 210 may identify Output (OUT1) and, starting at Output1, may proceeds backwards through the portion of the model to determine data dependencies for the model elements, as shown by arrows 510.

Figure 5D:
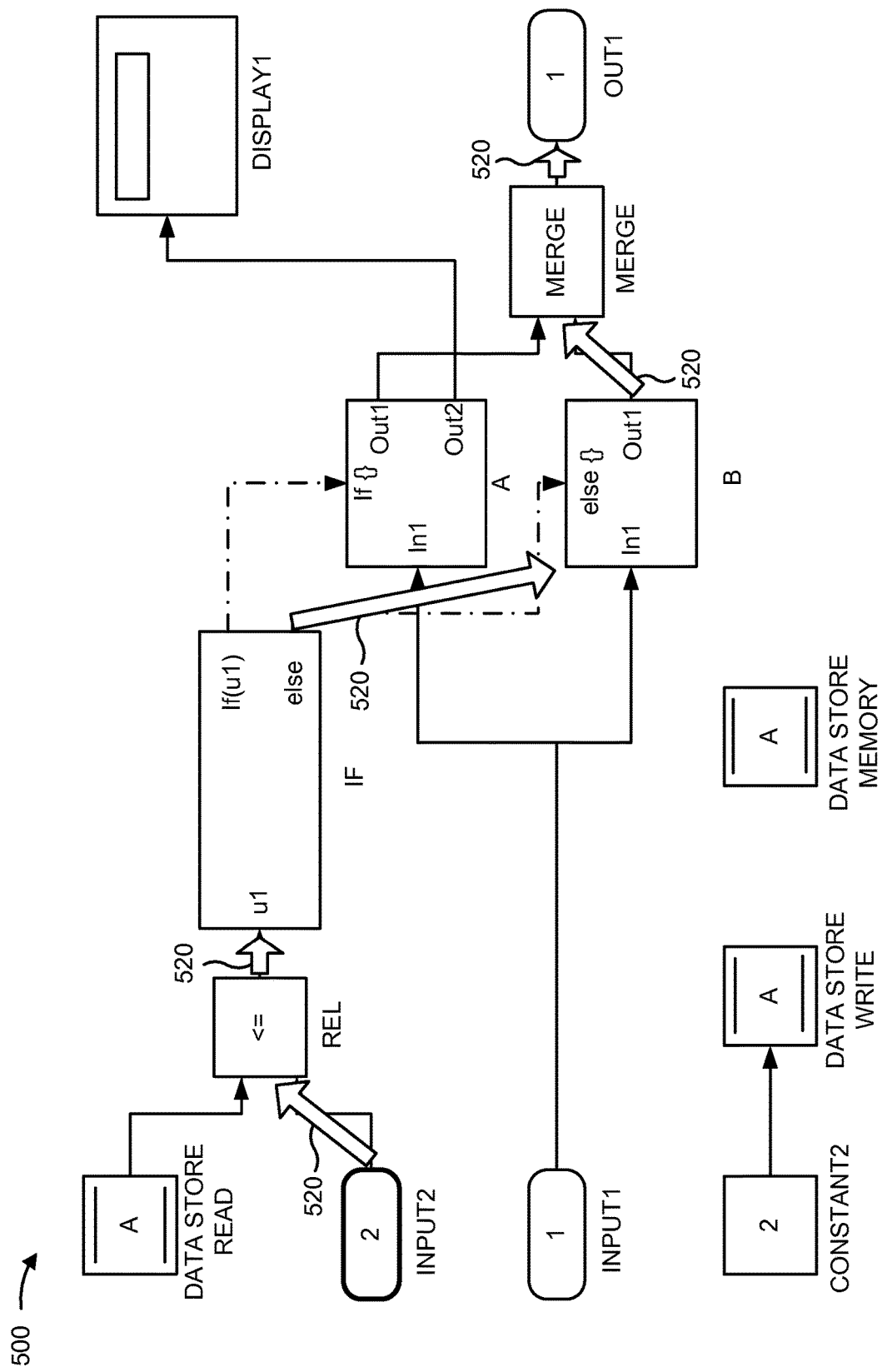

Referring now to FIG. 5D, client device 210 may identify Input2 and may propagate the input constraint (e.g., Input2 being set to 0.0) forward through the model based on the determined data dependencies to identify active model elements, as shown by arrows 520.

Figure 5E:
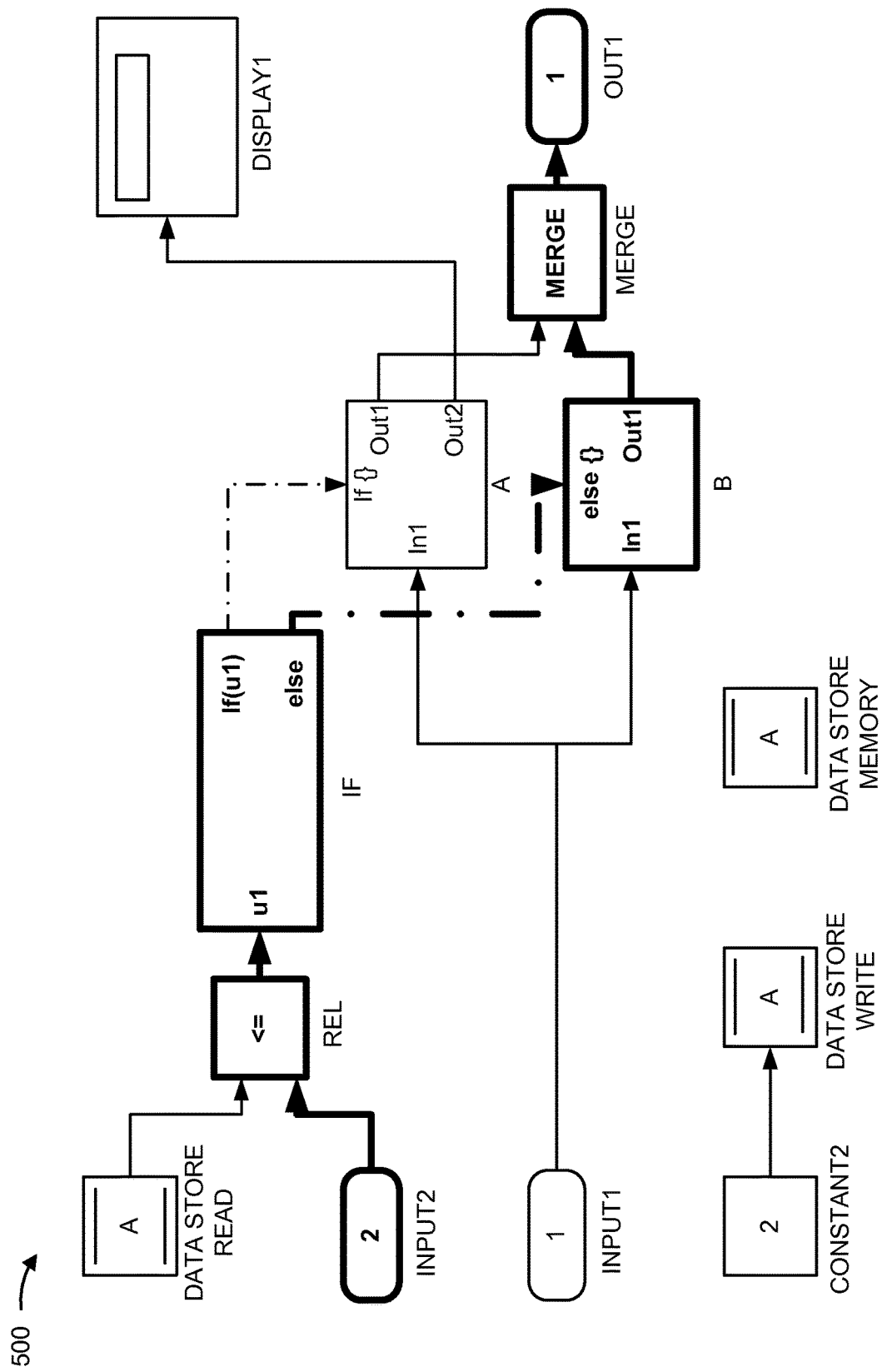

Referring now to FIG. 5E, client device 210 may output information identifying the active model elements to the user. As shown in FIG. 5E, client device 210 causes the active model elements to be visually distinguished (e.g., highlighted) from the other model elements.

Figure 5F:
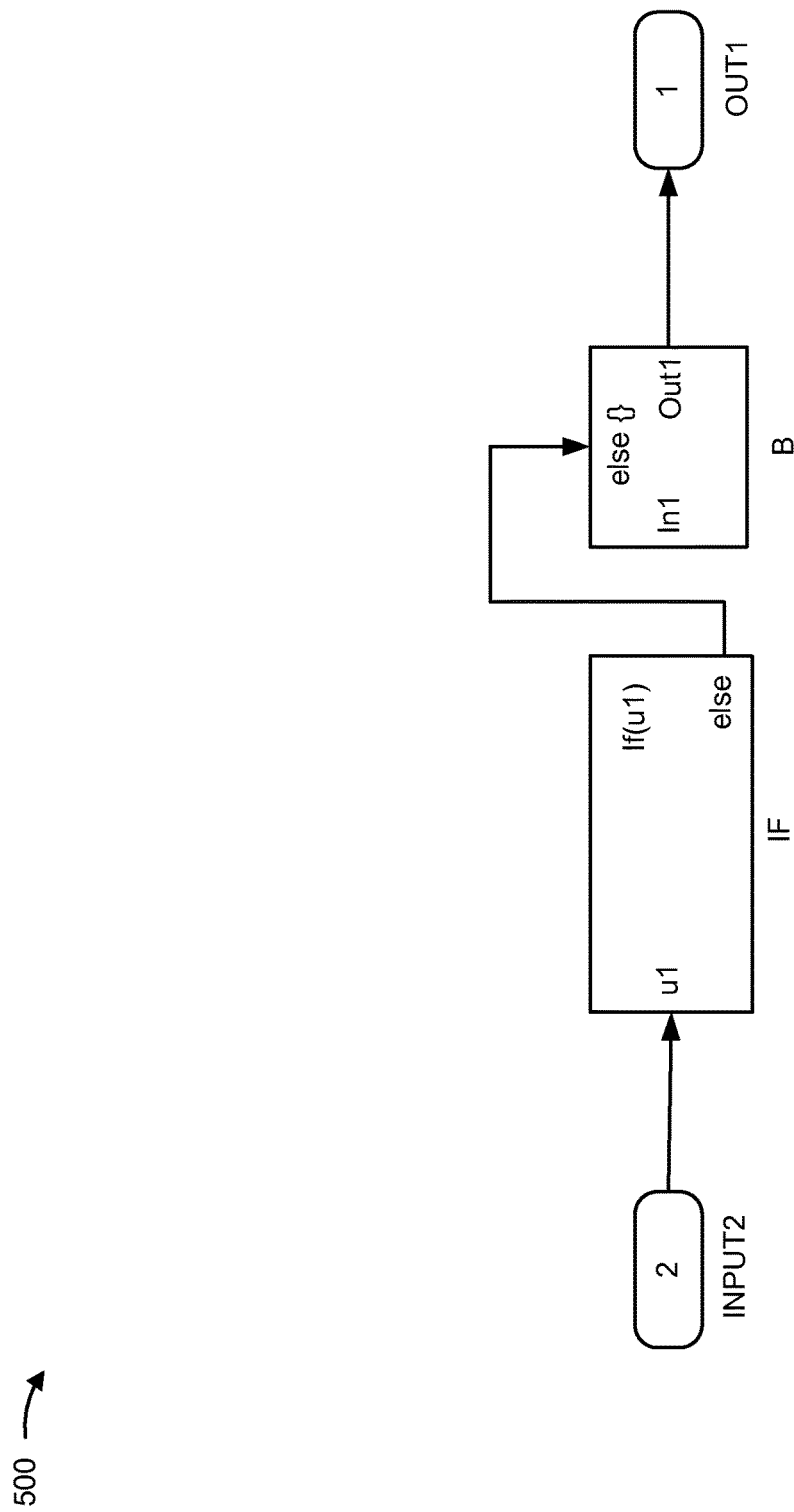
Figure 5G:
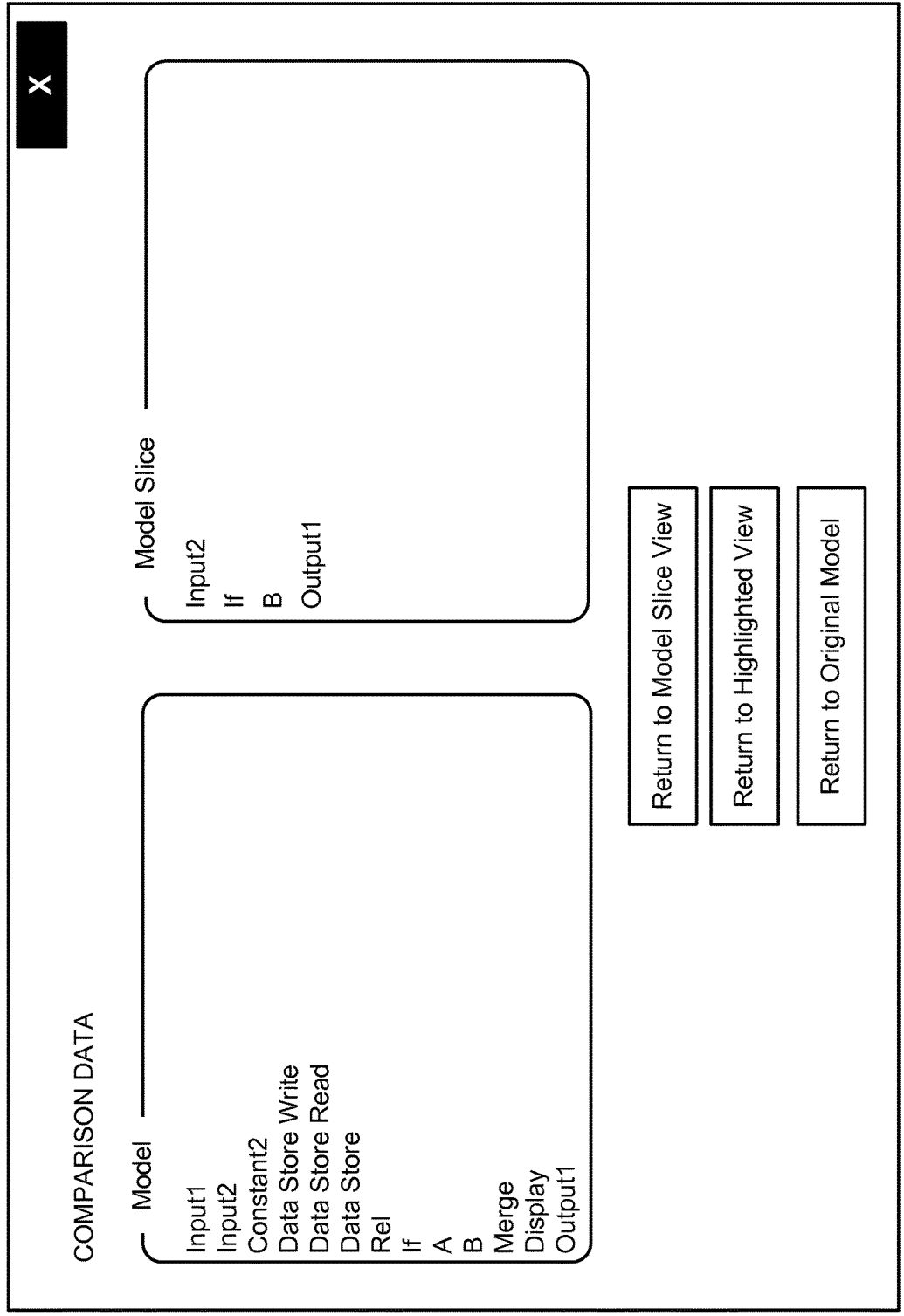

Referring now to FIG. 5F, client device 210 may remove all of the inactive model elements from the model and/or one or more active model elements from the model to generate a model slice. The model element Rel may be a relational operator that outputs a signal via the output port "If(u1)" when a first input is less than or equal to a second input and outputs a signal via the output port "else" when the first input is not less than or equal to the second input. Client device 210 may determine the model element Constant2 writes a value (2) to the Data Store Memory and that the value is provided to the model element Rel as the first input. Client device 210 may determine that the model element Rel receives the second input from Input2. Client device 210 may determine that when Input2 is set to 0.0 the first input is greater than the second input and that the model element Rel outputs the signal on the output port "else" to the model element B. Client device 210 may determine to remove the model element Rel from the model based on the first input always being greater than the second input. As shown in FIG. 5G, client device 210 replaces the model element Rel with a signal that connects Input2 to the model element If.

Client device 210 may determine that the model element Merge only receives the signal from the model element B. Client device 210 may determine to remove the model element Merge from the model based on the model element receiving a signal input. As shown in FIG. 5F, client device 210 replaces the model element Merge with signal that connects the model element B with Output1.

For FIG. 5G, assume that the user desires to determine differences between model elements included in the model and model elements included in the model slice and selects an option for accessing information identifying model elements included in the model and model elements included in the model slice. Referring to FIG. 5G, in response to the user selecting the option, client device 210 may provide a user interface for display to the user. As shown in FIG. 5G, the user interface lists the model elements included in the model in conjunction with the model elements included in the model slice to allow the user to quickly determine differences between the model and the model slice.

As indicated above, FIGS. 5A-5G are provided merely as an example. Other examples are possible and may differ from what was described with regard to FIGS. 5A-5G.

Figure 6A:
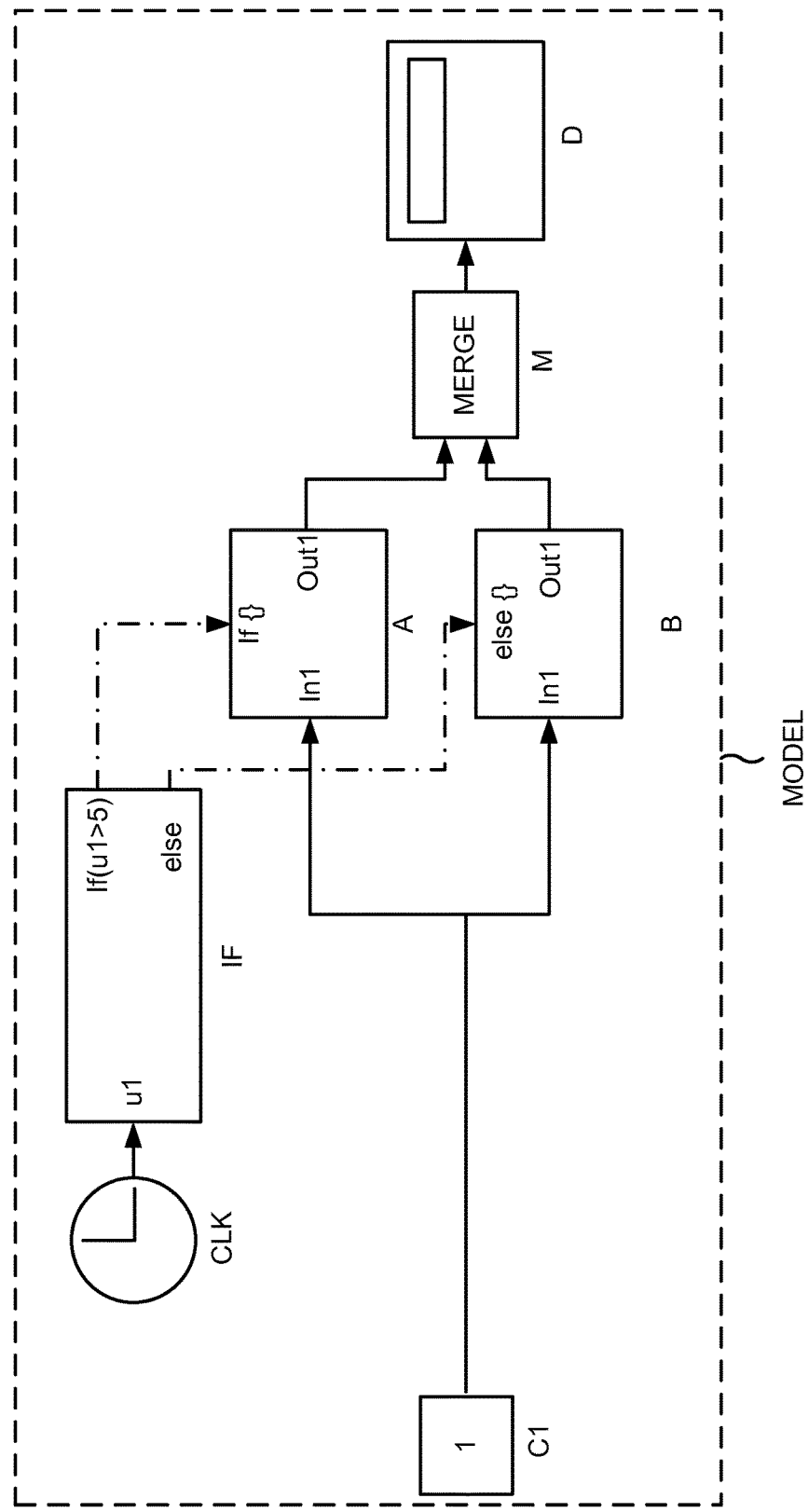
Figure 6B:
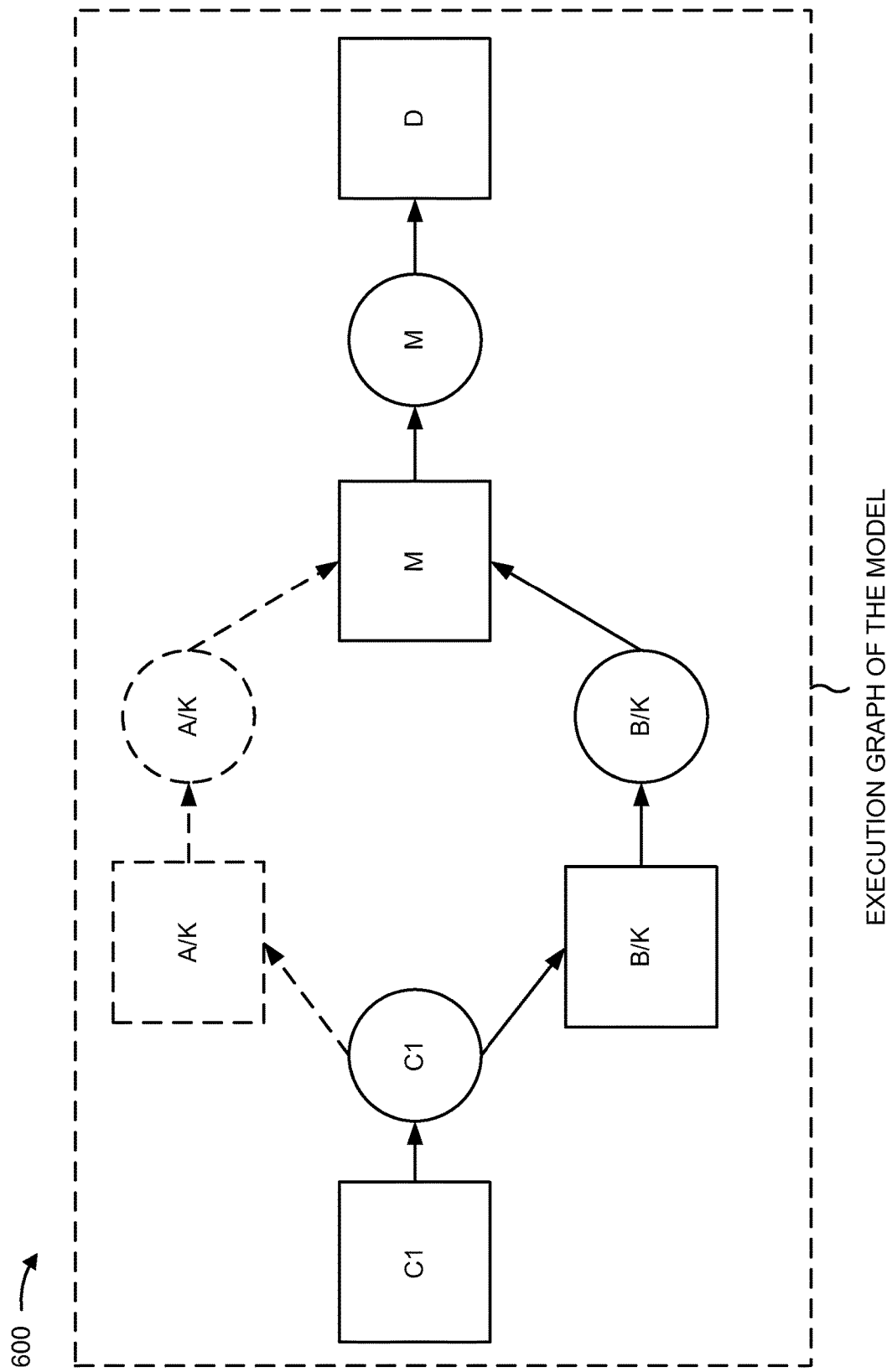
Figure 6C:
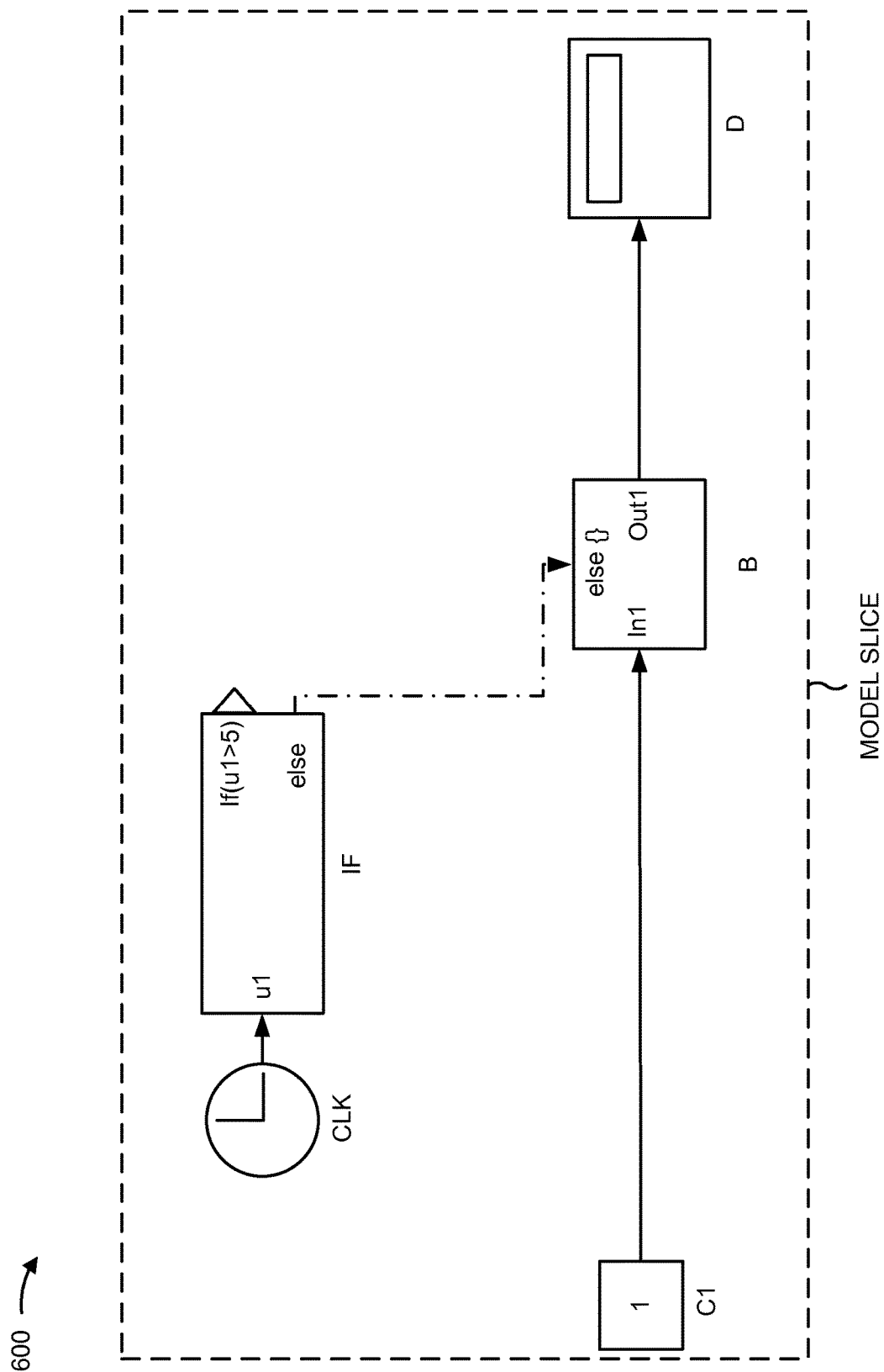

FIGS. 6A-6C are diagrams of an example 600 of process 400 described in connection with FIG. 4. For example 600, assume that client device 210 provides a model for display to a user and receives information identifying a design interest for the model. Referring now to FIG. 6A, the model may include a merge block M. The merge block may receive an output of block A and an output of Block B. The merge block may combine the received outputs and may output a result signal to a display block D.

For FIG. 6B, assume that client device 210, based on the design interest, constrains an input from the model element CLK to be less than 5. Further, assume that, based on the design interest, client device 210 generates an execution graph for the model and performs a dependency analysis using the execution graph. Referring now to FIG. 6B, client device 210 may provide the execution graph for display to the user. In the execution graph, inactive model elements may be shown using dotted lines and active model elements may be shown using solid lines. Based on the execution graph, client device 210 may determine that block A is inactive. Based on the block A being inactive, client device 210 may determine that the merge block is redundant.

For FIG. 6C, assume that client device 210 generates a model slice based on performing the dependency analysis described in connection with FIG. 6B, and provides the model slice for display to the user. Referring now to FIG. 6C, the merge block and block A may be removed from the model and an output of block B may be connected to an input of display block D.

As indicated above, FIGS. 6A-6C are provided merely as an example. Other examples are possible and may differ from what was described with regard to FIGS. 6A-6C.

FIGS. 7A-7E are diagrams illustrating an example 700 of process 400 described in connection with FIG. 4. For example 700, assume that client device 210 obtains a model that includes an Enabled subsystem E and that Enabled subsystem E includes a Gain block K. Further, assume that client device 210 analyzes the model based on a design interest received from a user. Further, assume that based on an analysis of the dynamics of the model, client device 210 determines that Enabled subsystem E is not active and that Enabled subsystem E being inactive disables Gain block K.

Figure 7A:
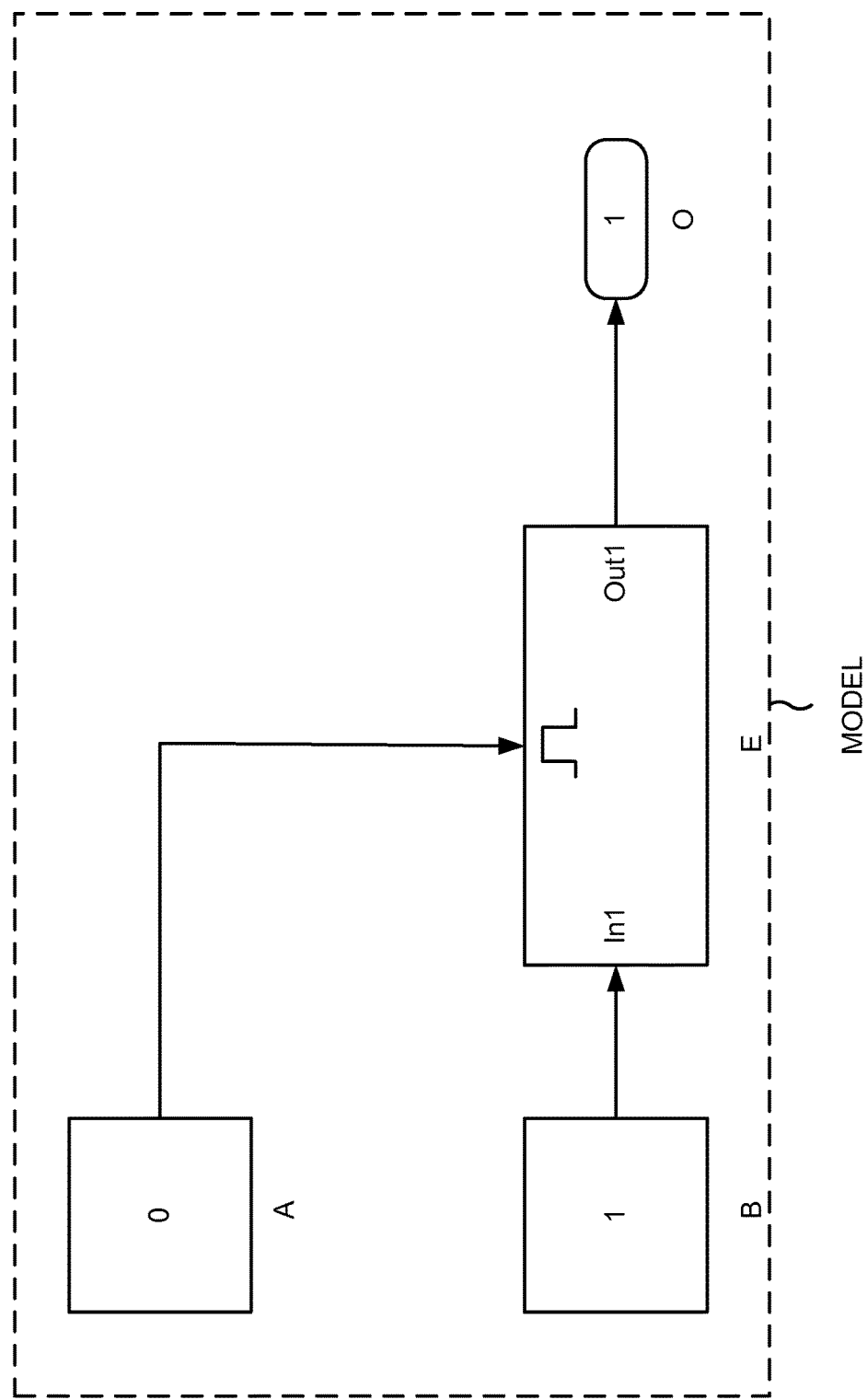

Referring to FIG. 7A, client device 210 may provide the model for display to the user. As shown in FIG. 7A, the model may include a block A that provides an enable signal to Enabled subsystem E and a block B that provides an input signal to an input port In1 of Enabled subsystem E. Enabled subsystem E may output a signal to an Outport block O.

Figure 7B:
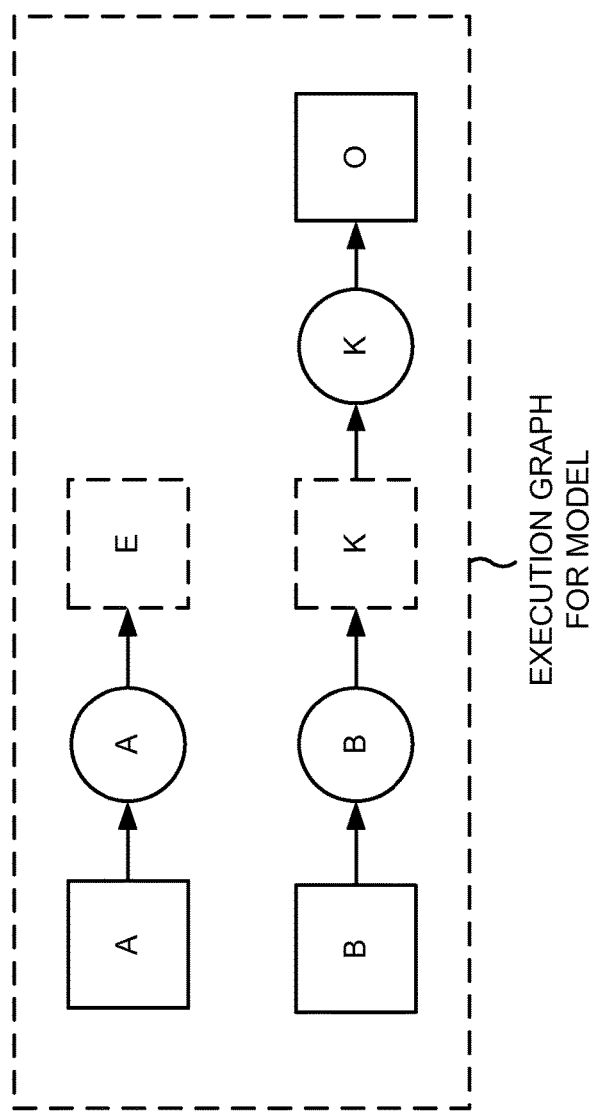

Referring now to FIG. 7B, client device 210 may provide an execution graph for display to the user. The execution graph may depict inactive and/or disabled model elements using dotted lines. As shown in FIG. 7B, the execution graph depicts Enabled subsystem E and Gain block K as being inactive and/or disabled.

Figure 7C:
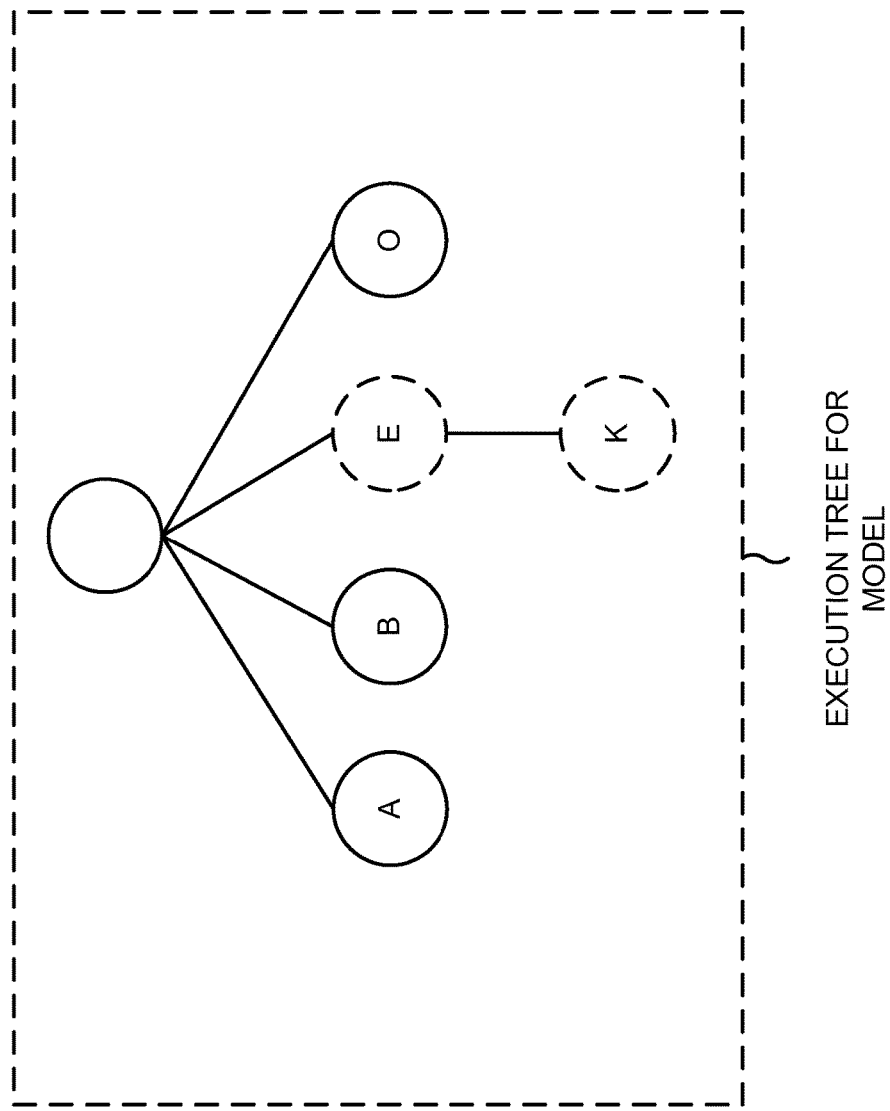

Referring now to FIG. 7C, client device 210 may provide an execution tree for the model. The execution tree may depict inactive and/or disabled model elements using dotted lines. As shown in FIG. 7C, the execution tree depicts Enabled subsystem E and Gain block K as being inactive and/or disabled. Based on the execution graph and the execution tree, client device 210 may determine that an output of Outport block O depends on an output of Gain block K in the disabled state.

Figure 7D:
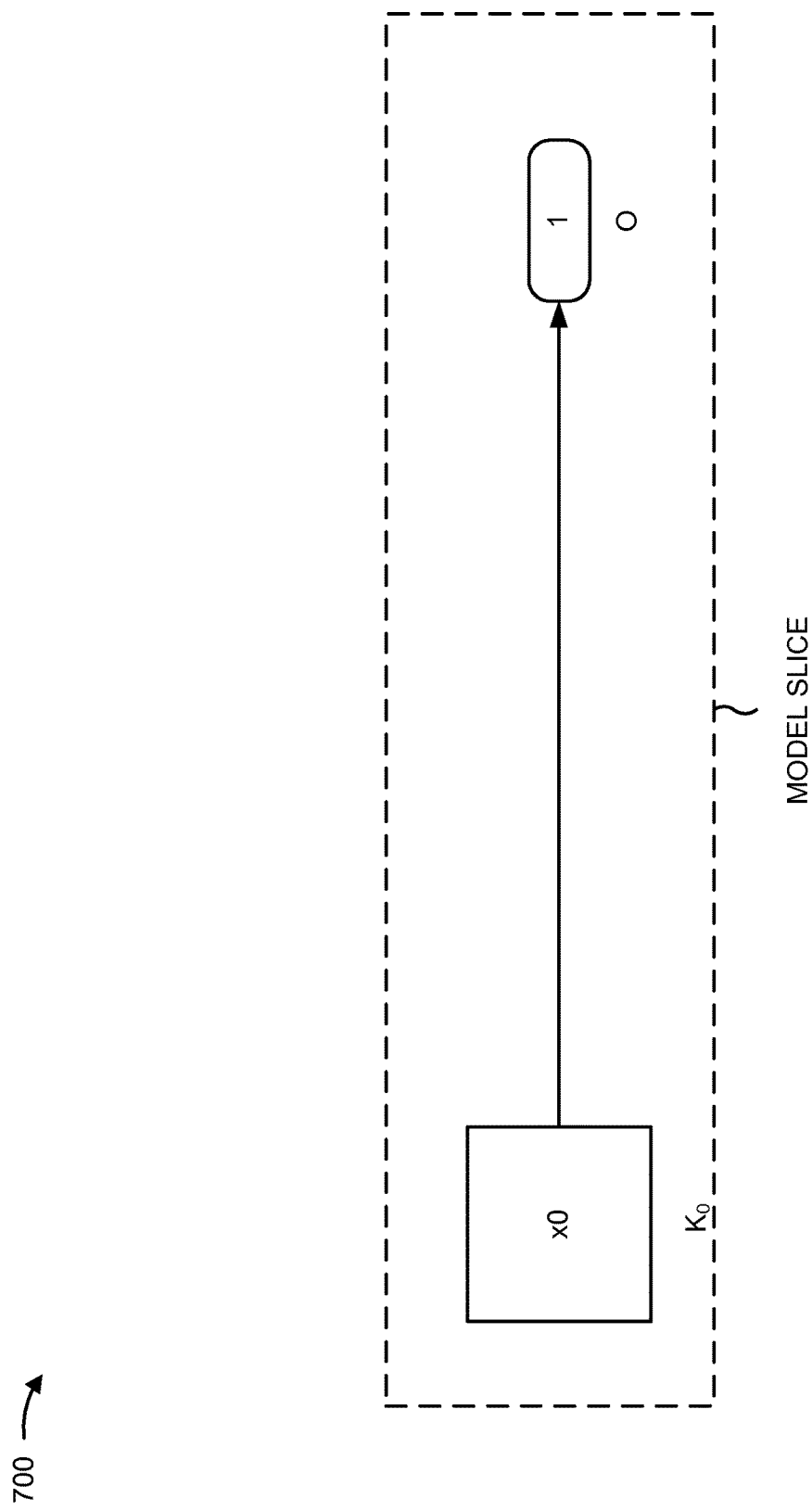

Referring now to FIG. 7D, assume that client device 210 generates a model slice of the model and causes the model slice to be displayed to the user. As shown in FIG. 7D, the model slice consists of Outport block O from the model. Because the output of Gain block K in the disabled state is used, client device 210 may include Gain block K as a state variable in the model slice.

Figure 7E:
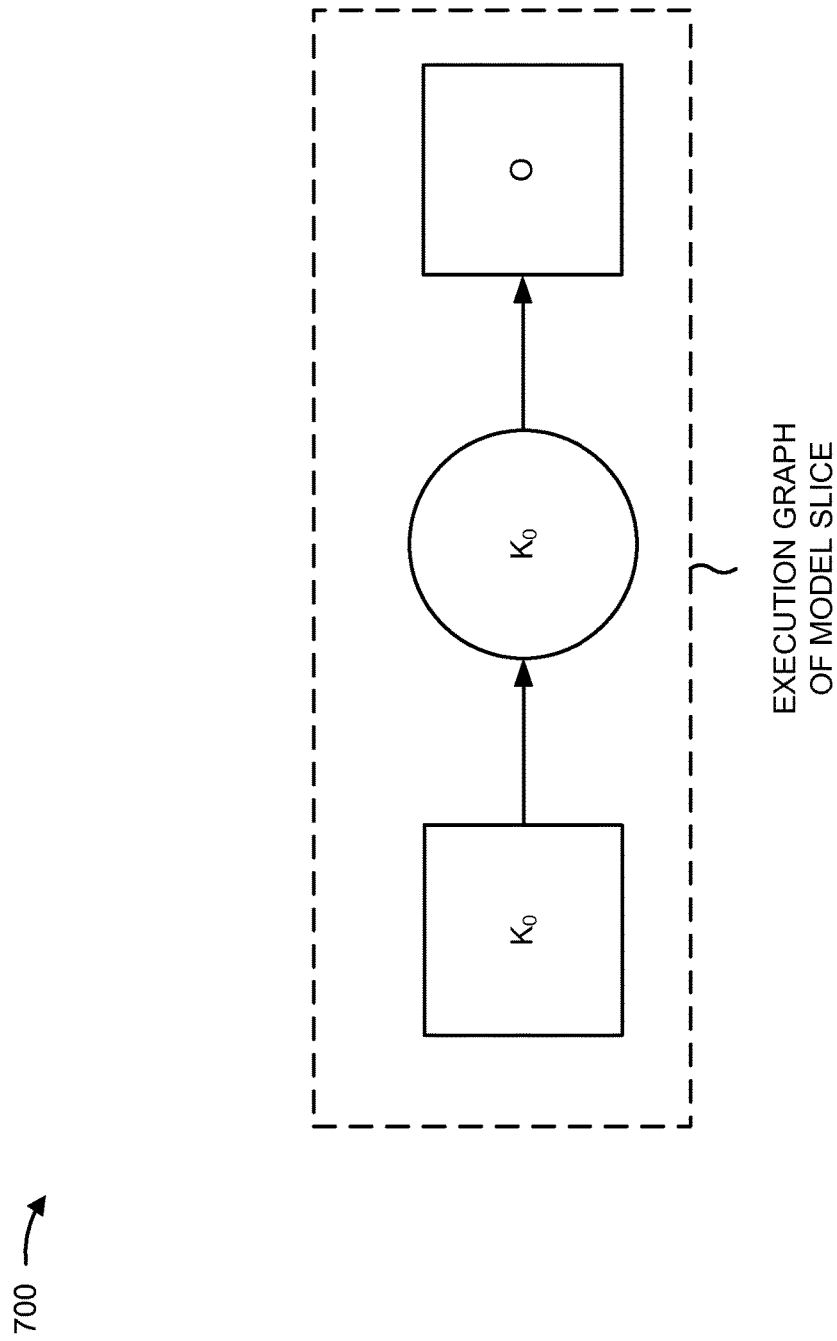

Referring now to FIG. 7E, assume that client device 210 generates an execution graph for the model slice and causes the execution tree to be displayed to the user. As shown in FIG. 7E, the execution graph may show that the output of Outport block O depends on the output of Gain block K in the disabled state.

As indicated above, FIGS. 7A-7E are provided merely as an example. Other examples are possible and may differ from what was described with regard to FIGS. 7A-7E.

The foregoing description provides illustration and description, but is not intended to be exhaustive or to limit the embodiments to the precise form disclosed. Modifications and variations are possible in light of the above teachings or may be acquired from practice of the implementations.

As used herein, the term device is intended to be broadly interpreted to refer to hardware or a combination of hardware and software, such as software executed by a processor.

It will be apparent that systems and methods, as described above, may be implemented in many different forms of software, firmware, and hardware in the implementations illustrated in the figures. The actual software code or specialized control hardware used to implement these systems and methods is not limiting of the implementations. Thus, the operation and behavior of the systems and methods were described without reference to the specific software code—it being understood that software and control hardware can be designed to implement the systems and methods based on the description herein.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

No element, act, or instruction used in the present application should be construed as critical or essential unless explicitly described as such. Also, as used herein, the article "a" is intended to include one or more items and may be used interchangeably with the phrase "one or more." Where only one item is intended, the term "one" or similar language is used. Further, the phrase "based on" is intended to mean "based, at least in part, on" unless explicitly stated otherwise.

What is claimed is:

1. A method comprising:
    accessing, by a device, an executable model,
        the executable model including graphical model elements, and, when executed, simulate a system;
    receiving, by the device, a design interest for the executable model,
        the design interest being associated with a behavior of a portion of the executable model;
    analyzing, by the device, the executable model based on the design interest;
    determining, by the device, a group of the graphical model elements that are related to the design interest, wherein the group of the graphical model elements is a subset of the graphical model elements within the executable model and the determining comprising:
        performing a dynamic analysis on the executable model to obtain coverage information associated with the executable model, and
        determining that the group of graphical model elements are in an active state during an execution of the executable model based on the coverage information; and outputting, by the device, a result,
    the outputting the result including one or more of:
        providing information identifying the group of the graphical model elements for display to a user, or
        generating an executable model slice that includes at least one of the graphical model elements from the group of the graphical model elements that are in the active state,
            the executable model slice, when executed, exhibiting a model slice behavior corresponding to the behavior of the portion of the executable model when executed.

2. The method of claim 1, further comprising:
    identifying a scope of analysis and a constraint for limiting an input of the executable model;
    performing, based on the scope of analysis and the constraint, a static analysis of the executable model;
    determining, based on the static analysis, a set of the group of the graphical model elements in an active state that are related to the design interest.

3. The method of claim 2, where the performing the static analysis includes:
    determining, based on the scope of analysis, data dependencies of a plurality of the graphical model elements based on following a signal backwards through the executable model, and
    propagating, based on the data dependencies, the constraint forward through the executable model; and
    where the determining the set of the group of the graphical model elements includes:
        determining the set of the group of the graphical model elements based on the propagating the constraint forward through the executable model.

4. The method of claim 1, the performing the dynamic analysis includes:
    determining, based on the design interest, a test case for executing the executable model, and
    determining model coverage information, for the executable model, using the test case.

5. The method of claim 1, further comprising:
    generating an arrangement of code segments that correspond to at least some of the graphical model elements of the executable model; and
    determining code coverage information for the executable model based on executing the arrangement of code segments.

6. The method of claim 1, wherein the executable model is a block diagram and the graphical model elements are blocks.

7. The method of claim 1, wherein the executable model slice is a graphical, block diagram and the at least one graphical model element is a block.

8. A device comprising:
one or more processors configured to:
access, from a memory, an executable model,
the executable model including graphical model elements, and, when executed, the executable model simulating a system;
receive a design interest for the executable model,
the design interest being associated with a behavior of a portion of the executable model;
analyze the executable model based on the design interest;
determine a group of the graphical model elements that are related to the design interest, wherein the group of the graphical model elements is a subset of the graphical model elements within the executable model and the determining comprising:
performing a dynamic analysis on the executable model to obtain coverage information associated with the executable model, and
determining that the group of graphical model elements are in an active state during an execution of the executable model based on the coverage information; and
generate an executable model slice that includes at least one graphical model element from the group of the graphical model elements that are in the active state, wherein,
when the executable model slice is executed, a model slice behavior of the executable model slice corresponds to the behavior of the portion of the executable model when executed.

9. The device of claim 8, where the one or more processors are further configured to:
determine, based on analyzing the behavior of the portion of the executable model, one or more modifications; and
update the executable model based on the one or more modifications.

10. The device of claim 8, when the performing the dynamic analysis, the one or more processors are further configured to:
determine, based on the design interest, a test case for executing the executable model, and
determine model coverage information, for the executable model, using the test case.

11. The device of claim 8, wherein the one or more processors are further configured to:
generate an arrangement of code segments that correspond to at least some of the graphical model elements of the executable model; and
determine code coverage information for the executable model based on executing the arrangement of code segments.

12. The device of claim 8, where, when the analyzing the executable model, the one or more processors are further configured to:
determine, based on the design interest, a constraint and a scope of analysis associated with one or more graphical model elements included in the executable model,
perform, based on the constraint and the scope of analysis, a formal static analysis of the executable model, and
determine, based on the formal static analysis, a set of the group of the graphical model elements in an active state that are related to the design interest.

13. The device of claim 12, where, when the performing the formal static analysis, the one or more processors are further configured to:
determine, based on the scope of analysis, data dependencies of a plurality of the graphical model elements included in the executable model based on following a signal backwards through the executable model, and
propagate, based on the data dependencies, the constraint forward through the executable model; and
where, when determining the set of the group of the graphical model elements, the one or more processors are further configured to:
determine the set of the group of the graphical model elements based on propagating the constraint forward through the executable model.

14. The device of claim 1, wherein the executable model is a block diagram and the graphical model elements are blocks.

15. The device of claim 1, wherein the executable model slice is a graphical, block diagram and the at least one graphical model element is a block.

16. A non-transitory computer-readable medium storing instructions, the instructions comprising:
one or more instructions that, when executed by one or more processors, cause the one or more processors to:
access, from a memory, an executable model,
the executable model including graphical model elements, and, when executed, simulating a system;
receive a design interest for the executable model,
the design interest being associated with a behavior of a portion of the executable model;
analyze the executable model based on the design interest;
determine, a group of the graphical model elements that are related to the design interest, wherein the group of the graphical model elements is a subset of the graphical model elements within the executable model and the determining comprising:
performing a dynamic analysis on the executable model to obtain coverage information associated with the executable model, and
determining that the group of graphical model elements are in an active state during an execution of the executable model based on the coverage information; and
output a result,
the one or more instructions to output the result further causing the one or more processors to at least one of:
provide information identifying the group of the graphical model elements for display to a user, or
generate an executable model slice that includes at least one graphical model element from the group of the graphical model elements that are in the active state,
the executable model slice, when executed, exhibiting a model slice behavior corresponding to the behavior of the portion of the executable model when executed.

17. The non-transitory computer-readable medium of claim 16, the one or more instructions to perform the dynamic analysis further cause the one or more processors to:

determine, based on the design interest, a test case for executing the executable model, and determine model coverage information, for the executable model, using the test case.

18. The non-transitory computer-readable medium of claim 16, the one or more instructions further cause the one or more processors to:

generate an arrangement of code segments that correspond to at least some of the graphical model elements of the executable model; and determine code coverage information, for the executable model, based on executing the arrangement of code segments.

19. The non-transitory computer-readable medium of claim 16, where the one or more instructions to analyze the model further cause the one or more processors to:

determine, based on the design interest, a constraint and a scope of analysis associated with one or more of the graphical model elements included in the executable model, perform, based on the constraint and the scope of analysis, a formal static analysis of the executable model, and determine, based on the formal static analysis, a set of the group of the graphical model elements in an active state that are related to the design interest.

20. The non-transitory computer-readable medium of claim 19, where the one or more instructions to perform the formal static analysis further cause the one or more processors to:

determine, based on the scope of analysis, data dependencies of a plurality of the graphical model elements by following a signal backwards through the executable model, and propagate, based on the data dependencies, the constraint forward through the executable model; and where the one or more instructions to determine the set of the group of the graphical model elements further cause the one or more processors to:

determine the set of the group of the graphical model elements based on propagating the constraint forward through the executable model.

21. The non-transitory computer-readable medium of claim 16, wherein the executable model is a block diagram and the graphical model elements are blocks.

22. The non-transitory computer-readable medium of claim 16, wherein the executable model slice is a graphical, block diagram and the at least one graphical model element is a block.

* * * * *